(12) United States Patent
Zhou

(10) Patent No.: US 6,574,852 B2
(45) Date of Patent: Jun. 10, 2003

(54) METHOD OF MAKING HIGH-TC SUPERCONDUCTING CERAMIC OXIDE TAPE

(76) Inventor: Dawei Zhou, 2026 NW. 36th St., Gainesville, FL (US) 32605

(*) Notice: Subject to any disclaimer, the term of this patent is extended or adjusted under 35 U.S.C. 154(b) by 57 days.

(21) Appl. No.: 10/074,788

(22) Filed: Oct. 29, 2001

(65) Prior Publication Data

US 2002/0095765 A1 Jul. 25, 2002

Related U.S. Application Data

(60) Division of application No. 09/084,558, filed on May 26, 1998, now Pat. No. 6,308,399, which is a continuation-in-part of application No. 08/487,882, filed on Jun. 7, 1995, now Pat. No. 5,756,427, which is a continuation-in-part of application No. 08/076,178, filed on Jun. 14, 1993, now Pat. No. 5,432,150, which is a continuation-in-part of application No. 07/716,929, filed on Jun. 18, 1991, now Pat. No. 5,219,832.

(51) Int. Cl.[7] .................................................. H01L 39/24
(52) U.S. Cl. ........................ 29/599; 505/430; 505/431; 505/739; 505/740
(58) Field of Search ............................ 29/599; 505/430, 505/431, 739, 740

(56) References Cited

U.S. PATENT DOCUMENTS 3,158,794 A  11/1964  Swartz
4,924,091 A   5/1990  Hansma et al.

(List continued on next page.)

FOREIGN PATENT DOCUMENTS

| EP | 0282286 | 9/1988 |
|----|---------|--------|
| EP | 0305820 | 3/1989 |
| EP | 0428244 | 5/1991 |
| JP | 5217438 | 8/1993 |
| WO | 8809312 | 12/1988 |
| WO | 9222931 | 12/1992 |

OTHER PUBLICATIONS

Babic, E. et al. (1994) "Magnetoresistance and V–I curves of Ag–sheathed $(Bi, Pb)_2Sr_2Ca_2Cu_3O_{10+y}$ tape" Physical Review B 49(21):15312–15316.

(List continued on next page.)

Primary Examiner—Carl J. Arbes
(74) Attorney, Agent, or Firm—Saliwanchik, Lloyd & Saliwanchik

(57) ABSTRACT

High-Tc superconducting ceramic oxide products and macroscopic and microscopic methods for making such high-Tc superconducting products. Completely sealed high-Tc superconducting ceramic oxide provides are made by a macroscopic process including the steps of pressing a superconducting ceramic oxide powder into a hollow body of a material inert to oxygen; heat treating the superconducting ceramic oxide powder packed body under conditions sufficient to sinter the ceramic oxide powder; and then sealing any openings of the body. Optionally, a waveform or multiple pulses of alternate magnetic filed can be applied during the heat treatment. The microscopic method of producing a high-Tc superconducting ceramic oxide product includes the steps of making a high-Tc superconducting ceramic oxide thin film; optionally sintering the deposited thin film in a magnetic filed; and removing partial oxygen content of the thin film by a scanning tunneling electron treatment machine to form a microscopic insulation layer between two high-Tc superconducting domains of the thin film.

24 Claims, 10 Drawing Sheets

U.S. PATENT DOCUMENTS

| | | | |
|---|---|---|---|
| 4,952,554 A | | 8/1990 | Jin et al. |
| 4,960,752 A | | 10/1990 | Ashok et al. |
| 4,970,197 A | | 11/1990 | Shiota et al. |
| 5,004,722 A | | 4/1991 | Tallman |
| 5,047,633 A | | 9/1991 | Finlani et al. |
| 5,051,397 A | | 9/1991 | Sato et al. |
| 5,075,286 A | | 12/1991 | Powell et al. |
| 5,098,878 A | | 3/1992 | Wongs et al. |
| 5,116,810 A | | 5/1992 | Joshi et al. |
| 5,166,919 A | | 11/1992 | Eigler |
| 5,204,315 A | | 4/1993 | Ito et al. |
| 5,219,832 A | | 6/1993 | Zhou |
| 5,232,906 A | | 8/1993 | Yamamoto et al. |
| 5,244,876 A | | 9/1993 | Preisler et al. |
| 5,304,534 A | * | 4/1994 | Ciszek |
| 5,304,602 A | | 4/1994 | Yamamoto et al. |
| 5,432,150 A | * | 7/1995 | Zhou |
| 5,756,427 A | * | 5/1998 | Zhou |

OTHER PUBLICATIONS

Calestani, G. et al. (1993) "Effects of simultaneous Pb/Bi and Y/Ca substitution on structural and superconducting properties of the 2212 BSCCO phase" Journal of Alloys and Compounds 195:315–322.

Calestani, G. et al. (1993) "Effects of the annealing conditions on the structural and superconducting properties of $B1_{2-x}Pb_xSr_2Y_{0.2}Ca_{0.8}Cu_2O_z$" Physica C 206:33–42.

Chanda, B., T.K. Dey (1993) "Heat conduction in vanadium substituted $(Bi_{0.8}Pb_{0.2-y}Vv)2Sr2Ca2Cu3Ox$ sinteed pellets between 10 and 150 K" Cryogenics 33(10):980–985.

Che, G.C. et al. (1989) "Composition and superconductivity in Bi–Sr–Ca–Cu–O and substituted systems" J. Master. Sc. 24:125–1728.

Chen, F. et al. (1991) "Biaxially aligned high $T_c$ superconductors" Appl. Phys. Lett. 58(5):531–533.

Chrambach, A. (1991) "Electrophoresis" Enclycopedia of Physics, $2^{nd}$ Edition, pp. 324–325.

Chu, C.T., B. Dunn (1989) "Fabrication of $Yba_2Cu_3O_{7-y}$ superconducting coatings by electrophoretic deposition" Appl. Phys. Lett. 55(5):492–494.

Dou, S.X. et al. (1992) "Improvement of flux pinning in the Ag-clad Bi–Pb–Sr–Ca–Cu–O wires through the use of a short period melt processing" Appl. Phys. Let. 60(23):2929–2931.

Ehmann, A. et al. (1993) "Bi cuprates of type 1212—new family of superconductors in the Bi series" Journal of Alloys and Compounds 195:57–60.

Fung, P.C.W. et al. (1990) "Vanadium substituted 2212 and 2223 superconducting ceramics" Solid State Communications 75(3):211–216.

Haldar, P. et al. (1995) Oral Presentation at DOE HTS Wire Development Workshop, St. Petersburg, Florida, Jan. 31–Feb. 1, 1995.

Hein, M. et al. (1989) "Electrophoretic disposition of textured $Yba_2Cu_3O_{7-x}$ ilms on silver substrates" J. Appl. Phys. 66(12):5940–5943.

Ho, J.C. et al. (1991) Melt–textured thick films of $Bi_{1.7}Pb_{0.3}Sr_2CaCu_2O_y$ Superconductor Science and Technology 4:507–508.

Kao, C.H. et al. (1994) "A Study of Bi–Pb–Sr–Ca–Cu–O/Ag tape prepared by the jelly–roll procss" Supercond. Sci. Technol. 7:470–472.

Kao, C.H. et al. (1993) "Fabrication of $Bi_{1.7}Pb_{0.4}Sr_{1.6}Ca_{2.4}Cu_{3.6}O_y$ superconducting films on silver substrates by the electrophoretic deposition technique" Journal of Materials Science Letters 12:1793–1794.

Leghissa, M. et al. (1993) "observation of a disordered vortex state in $Bi_2Sr_2CaCu_2O_{8-x}$ single crystals containing columnar defects" Physical Review B 48(2):1341–1344.

Liu, H.K. et al. (1991) "Fabrication of Ag–Sheathed Bi–Superconducting Tapes and Coils" J. Mater. Res. 6:2287–2290.

Liu, R.S. et al. (1990) et al. (1990) "Superconductivity up to 105K in the new High–$T_c$ TI–V–Sr–Ca–Cu–O and TI–V–Sr–Ca–Y–Cu–O Systems" Solid State Communications 76(11):1261–1265.

Maley, M.P, et al. (1990) "Oral Presentation at DOE HTSC Wire Development Workshop", Jan., Florida.

Nojima, H. et al. (1990) "Fabrication of Y–Ba–Cu–O Superconducting Films on Cu Substrates by an Electrophoretic Deposition Technique" Japanese Journal of Applied Physics 29(9):1655–1658.

Pont, M. et al. (1993) "Effect of Cr and V substitution on the properties of bulk Tl–based superconductors" Cryogenics 33(1):91–96.

Ren, Z.F., J.H. Wang (1993) "Superior flux pinning in in situ synthesized silver–sheathed superconducting tape of $Ti_{0.5}Pb_{0.5}Sr_{1.6}Ba_{0.4}Ca_{0.8}Y_{0.2}Cu_2O_y$" Appl. Phys. Lett. 62(23):3025–3027.

Rose–Innes, A.C., E. H. Rhoderick (1978) "The Mixed State" Introduction to Superconductivity, vol. 6, pp. 183–197.

Sarkar, P. et al. (1991) "Fabrication of textured Bi–Sr––Ca–Cu–O thick film by electrophoretic deposition" J. Appl. Phys. 69(3):1775–1777.

Sengupta, S. et al. (1993) "Effective Activation Energy in the Bi–Sr–Ca–Cu–O Systems" IEEE Transactions of Applied Superconductivity 3(1):1226–1228.

Shaked, H. et al. Physica C—Crystal Structures of the High–Tc Superconducting Copper–Oxides, pp. 1–71.

Sheahen, T.P. (1994) Introduction to High–Temperature Superconductivity.

Thompson, J.R. et al. (1992) "Enhanced current density $J_c$ and extended irreversibility in single–crystal $Bi_2Sr_2Ca_1Cu_2O_8$ via linear defects from heavy ion irradiation" Appl. Phys. Lett. 60(18):2306–2308.

Tilley, D.R., J. Tilley (1990) Superfluidity and Superconductivity, Third Edition, pp. 208–224.

Zhou, D., N.S. Sullivan (1989) "Collective Quantum Tunneling Model of High–$T_c$ Superconductors" Physica C162–164:813–814.

Woolf, L.D. et al. (1991) "Fabrication of Long Length Bi–2223 Superconductor Tape Using A Continous Electrophoretic Coating Process" Appl. Phys. Letter 58:534–536.

Xin, Y. et al. (1990) "Optimum Fabrication Process and Some Relevant Analysis for the Vanadium–Lead Doubly Substituted 2223 Superconducting Ceramics" Solid State Communications 76(12):1347–1350.

Xin, Y. et al. (1990) "Vanadium–Lead Substituted 2223 Bi–Sr–Ca–Cu–O Superconductors" Solid State Communications 76(12):1351–1356.

Xue, J.S. et al. (1991) "Crystal growth and characterization of superconducting lead cuprates" Journal of Crystal Growth 113:371–378.

* cited by examiner

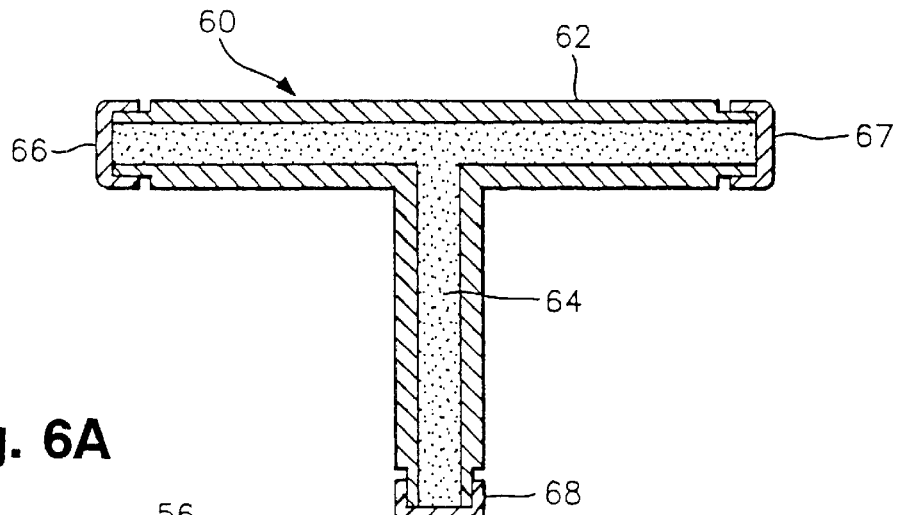
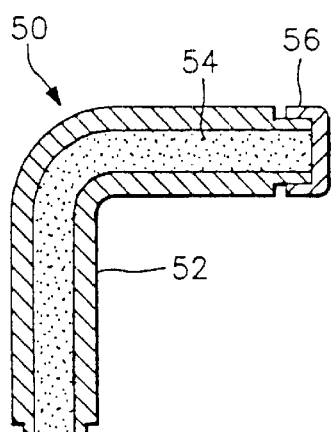
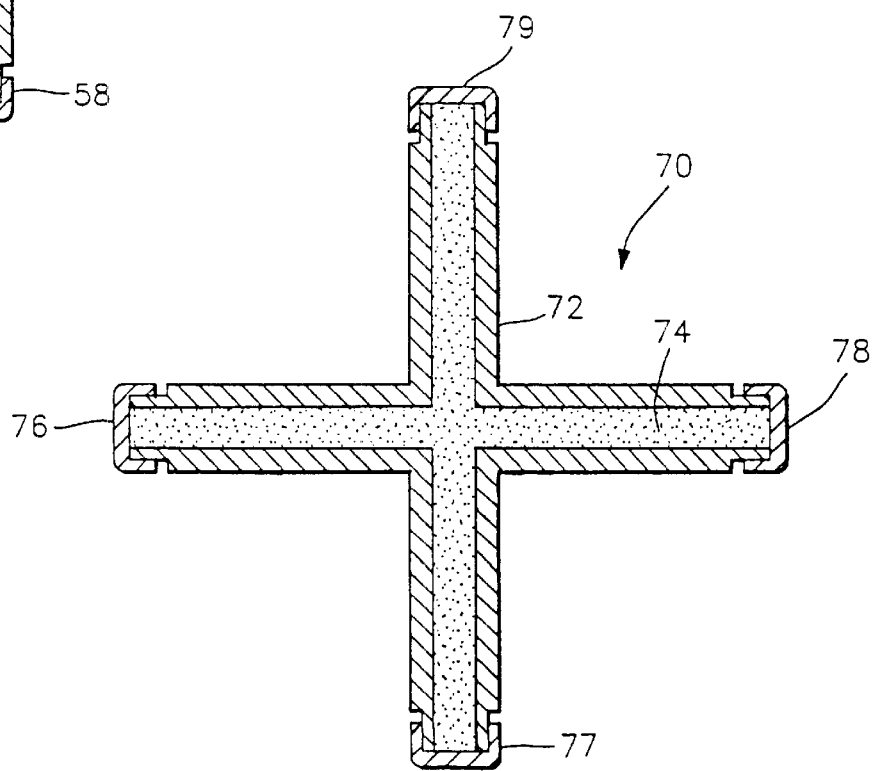

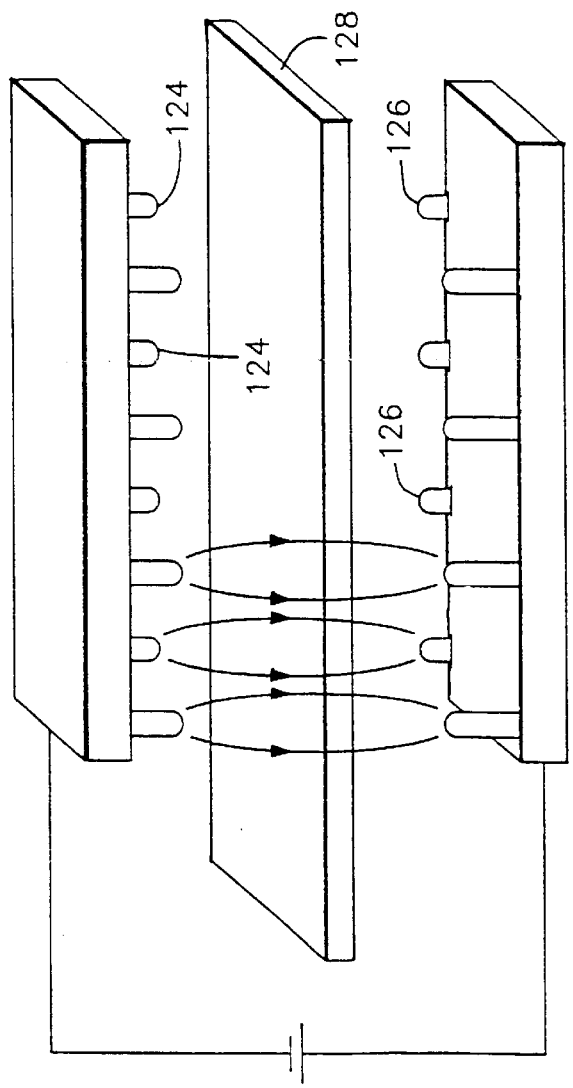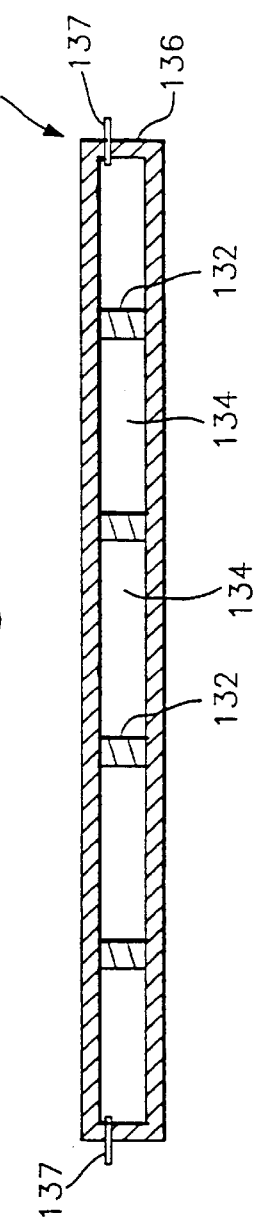

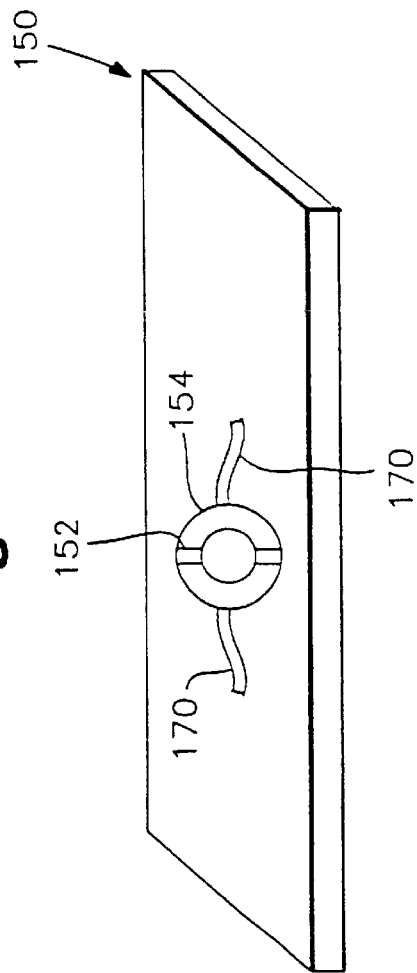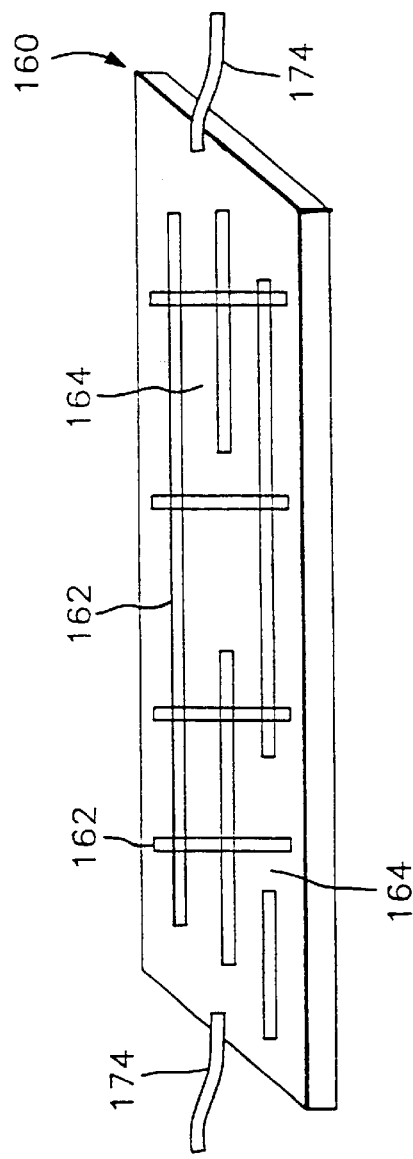

METHOD OF MAKING HIGH-TC SUPERCONDUCTING CERAMIC OXIDE TAPE

CROSS-REFERENCE TO RELATED APPLICATIONS

This application is a divisional of application Ser. No. 09/084,558, filed May 26, 1998, now U.S. Pat. No. 6,308, 399 which is a continuation-in-part of application Ser. No. 08/487,882, filed Jun. 7, 1995; now U.S. Pat. No. 5,756,427, which is a continuation-in-part of application Ser. No. 08/076,178, filed Jun. 14, 1993, now U.S. Pat. No. 5,432, 150; which is a continuation-in-part of application Ser. No. 07/716,929, filed Jun. 18, 1991, now U.S. Pat. No. 5,219, 832.

BACKGROUND OF THE INVENTION

The present invention relates to high-Tc superconducting ceramic oxide products, and macroscopic and microscopic methods for making such high-Tc superconducting products. The high-Tc superconducting ceramic oxide products of the present invention have a high critical current density, high critical magnetic field, long life, and are capable of being recharged or having superconductivity regenerated.

Since the initial discovery of high-Tc superconductivity in metal-oxide ceramics, many people have tried to determine the underlying physical origin of this superconductivity. It is generally agreed that the microstructure of the $CuO_2$ plane of high-Tc superconductors plays a key role in high-Tc superconductivity. Viewed in two dimensions, there are four oxygen atoms around a single Cu atom in high-Tc metal-oxide superconducting ceramics (in three dimensions, there would be six oxygen atoms around one Cu atom), and each Cu atom can supply at most three electrons to its nearest neighbors. This means that there can be no stable valence bond between the Cu atoms and the oxygen atoms. The Cu electrons are, therefore, only weakly localized and can pass across the oxygen bridges to complete quantum tunneling. Such collective quantum tunneling plays the key role in the high-Tc superconductivity. Since the exchange interaction between the two Cu ions is mediated via the oxygen ions, the extra spin of a hole localized on the oxygen will have a big effect. Designating the two Cu ion spins by $S_1$ and $S_2$, and the O by, the would prefer to be parallel or antiparallel in respect to both $S_1$ and $S_2$. The spins of high-Tc superconductors are, therefore, very disordered. The local spin wave function is either symmetric or antisymmetric and is rapidly changing with time, because of the mixed valence resonance vibration. The disordered spin wave function will be automatically adjusted to accompany the tunneling electrons.

The present invention relates to new methods of making completely sealed high-Tc superconducting products using metallic oxide ceramics, and to the completely sealed high-Tc superconducting products produced thereby. The inventive methods and products are based on the realization that the oxygen content of the metal-oxides plays an important role in high-Tc superconductors and products incorporating the same. Below a critical oxygen content $X_{c1}(O)$, or above a critical oxygen content $X_{c2}(O)$, superconductivity is destroyed. The transition temperature Tc changes in between these critical concentrations. For example, for the superconducting oxide system $YBa_2Cu_3O_x$, $X_{c1}(O)=6.5$ and $X_{c2}(O)=7.0$. Experiments show that if oxygen atoms escape from high-Tc superconductors, thereby lowering the oxygen content to less than the critical oxygen content $X_{c1}$, the superconductivity of the metal-oxide is destroyed. If the oxygen content is then increased, for example by sintering the oxygen-depleted metal-oxide ceramic within a predetermined temperature range in the presence of oxygen, the superconductivity will be restored. The principal point is that for $YBa_2Cu_3O_x$ superconductors, the oxygen content X(O) must satisfy the equation $6.5<(O)<7.0$, and for all high-Tc oxide superconductors the oxygen content X(O) must satisfy the equation $X_{c1}<X(O)<X_{c2}$.

The high-Tc superconductivity state of oxide ceramics is only a metastable state, and the superconductive oxide ceramics will tend to lose oxygen to become a stable state insulator. This process of oxygen loss may take a few hours, a few days, a few months, or even a few years or longer depending upon the conditions surrounding the superconductive oxide including temperature, atmosphere, and the like. However, regardless of how long the oxygen loss process may take, the tendency of the metastable superconductive state to change to the stable insulative state is certain. Therefore, to protect the high-Tc superconductivity of oxide ceramics, the oxygen content of the ceramic corresponding to the superconductive state must be maintained.

The present invention provides a completely sealed superconducting product whereby the oxygen loss is prevented and a long-lived high-Tc superconducting ceramic oxide product is attained. As described in detail, hereinafter, the seal can be made using metal, plastic or any materials which are inert to oxygen.

The present invention is also based on the recognition that the high-Tc superconductors are ceramic materials, a basic property of which is brittleness. Because of this brittle characteristic of ceramic superconductors, many attempts were made to produce high-Tc superconducting ceramic products using traditional methods to make wires, cables, tapes and the like, and then making superconducting products from the superconducting ceramic-containing wires, cables and tapes. Examples of such wire, cable and tape methods of producing superconducting ceramic products include: U.S. Pat. Nos. 4,952,554; 4,965,249; 4,975,416; and 4,973,574. Other methods of making superconducting ceramic products are shown, for example, in the following U.S. Patents: U.S. Pat. Nos. 4,975,411; 4,975,412; 4,974, 113; 4,970,483; 4,968,662; 4,957,901; 4,975,414; and 4,939, 121.

However, all of these prior attempts to make high-Tc superconducting ceramic oxide products suffer from one or more disadvantages. The wire and cable making methods typically include a drawing or working step to reduce the diameter of the superconducting ceramic oxide product. Such drawing and working steps are liable to break the brittle ceramic oxide product, therefore the breaking and sintering cycles will repeat again and again and the resulting wires have poor flexibility and discontinuity caused by breaking. This is called "crack" and "sausage" problems in HTSC wire making. Further, prior attempts to produce superconducting ceramic products have not had the high mass density necessary to achieve high current density, have had an insufficient ratio of superconducting cross-sectional area to non-superconducting cross-sectional area, and have suffered undesirable oxygen loss resulting in loss of superconductivity. In addition, prior methods of making high-Tc superconducting ceramic oxide products have been costly, involving expensive materials and numerous, time consuming steps, and have produced products of only limited shapes suitable for only limited applications. Also, prior methods could not, or could not easily, make high-Tc superconducting connections, which is necessary, especially for making a high-Tc superconducting magnet. A key technology for making high-Tc superconductive magnets is the making of zero resistance connections.

This invention also attempts to apply an alternative or a selective waveform pulse magnetic field to destroy the magnetic moment order (which does not do good to the high-Tc superconductivity), to accelerate oxygen to occupy the positions of $CuO_2$ planes, and to orient the $CuO_2$ plane to a desired direction by the dynamic process of the alternate field during the heat treatment. This invention using a dynamic field has high efficiency compared with a static magnetic field. This is because $dM/dt=\gamma M \times H(t)$, M is magnetization and H(t) is alternate field. The dynamics is very important; therefore, alternate field will rapidly rotate magnetic moment randomly, and create the condition to accelerate oxygen to occupy position on $CuO_2$ plane, because AF local magnetic order resists diffusion of oxygen. Therefore, the applied alternate filed is much better than an applied static magnetic field.

BRIEF SUMMARY OF THE INVENTION

The present invention relates to high-Tc superconducting ceramic oxide products and to macroscopic and microscopic methods of making such products. The superconducting ceramic oxide used to produce the superconducting products of the invention can be any superconducting ceramic oxide (including the Al oxide family) and, for example is an $REBa_2Cu_3O_{9-\delta}$ ceramic, wherein RE is one or more rare earth elements from the group Y, La, Eu, Lu and Sc, and $\delta$ is typically in the range from 1.5 to 2.5. One specific ceramic oxide for use in the products of the present invention is $YBa_2Cu_3O_x$, wherein X is between 6.5 and 7.0. Other examples of suitable high-Tc superconducting ceramic oxides include: $Bi_2Sr_2Ca_2Cu_3O_X$, HgBaCaCuO system, (Bi, Pb)$_2Sr_2Ca_2Cu_3O_X$, $Bi_2Sr_2CaCu_2O_{8+X}$, $La_{2-x}Sr_xCuO_{4+Y}$ and $Tl_2Ba_2Ca_{n-1}Cu_nO_{2n+3}$.

The high-Tc superconducting ceramic oxide product of the present invention are produced such that oxygen loss is minimized or substantially prevented and the superconducting properties of the ceramic oxide products are maintained for a substantial, even indefinite, period of time. One method for producing a superconducting ceramic oxide product according to the present invention is a macroscopic method of producing completely sealed high-Tc superconducting ceramic oxide products. This macroscopic method comprises the steps of making a superconducting ceramic oxide powder; providing a hollow body of a material which does not react with oxygen; pressing the superconducting ceramic oxide powder into the hollow body at a net pressure of at least from $5 \times 10^4$ psi to $1 \times 10^7$ psi, preferably at least $1.2 \times 10^5$ psi for $YBa_2Cu_3O_X$ (the pressure will depend upon the material and shape; beside making monofilament HTSC wire or tape, the cross-section may be reduced by deformation, such as by swaging, extrusion, drawing, or rolling; thereafter, the smaller cross-sectional wires may be packed into a larger tube, which is then repeatedly deformed, to form a multifilament HTSC wire or tape); heat treatment the body with the superconducting ceramic oxide powder pressed therein in an oxygen atmosphere at temperatures and for time periods of sintering, annealing and cooling which are sufficient for sintering the ceramic oxide powder; optionally applying a waveform or multiple pulses of alternate magnetic field (from 0.0001 Tesla to 300 Tesla) during the sintering and subsequent heat treatment produce to dynamically destroy local magnetic moment and dynamically accelerate oxygen to occupy positions in the $CuO_2$ planes and dynamically to orient the microscopic $CuO_2$ plane to desired direction to carry high critical current and high critical field, the applied field strength varying with the material and the shape of the products; and then sealing the ends of the body and/or any other openings which may have been formed in the body prior to sintering. Local heat treatment can also be used to make connections between high-Tc superconducting products or a product and superconducting lead. If the superconducting ceramic oxide product has a complicated shape, connections between hollow bodies having the superconducting ceramic oxide powder pressed therein are joined and then a second pressing step is performed to ensure that all connections are filled with superconducting powder continuously without any gaps before sintering.

The completely sealed high-Tc superconducting ceramic oxide products produced by the macroscopic method of this invention may be of any desired shape and size and are suitable for use as high-Tc superconducting magnets, high-Tc superconducting motors, high-Tc superconducting generators, high-Tc superconducting transportation lines, high-Tc superconducting electric energy storage devices, or components thereof, and, in general, may be used for any purpose which requires a superconductor.

The microscopic method of producing a high-Tc superconducting ceramic oxide product of the present invention is also based on the isolation (or "sealing") of a superconducting ceramic oxide composition to prevent oxygen loss or diffusion and the resultant loss of superconductivity. The inventive microscopic method of making high-Tc superconducting ceramic oxide products comprises the steps of: making a high-Tc superconducting ceramic oxide thin film on a substrate in situ, optionally with an alternate magnetic field being applied during the in situ making process by electron beam deposition, molecular beam deposition, sputtering deposition, laser ablation or any other suitable means, and optionally then sintering the deposited thin film in a magnetic field in an oxygen atmosphere, if necessary; and removing partial oxygen content by a scanning tunneling electron treatment machine (STETM) from a microscopic domain, e.g., 5 Å to 1000 Å, of the superconducting ceramic oxide thin film to form a microscopic insulation layer between two high-Tc superconducting domains which form a Josephson junction. High-Tc superconducting products made by the microscopic method of the present invention are particularly useful as high-Tc superconducting chips, high-Tc superconducting electric circuits, SQUIDS, the component thereof.

Therefore, it is an object of the present invention to provide high-Tc superconducting ceramic oxide products which do not suffer from the disadvantages of prior superconducting ceramic products.

Another object is to modify a scanning tunneling microscope machine to a STETM, that is, from a microscope to an electron treatment machine for making microscopic patterns as desired by localized electric current and which not only can be used to produce high-Tc superconducting products but also can be used in the semiconductor industry.

Another object of the present invention is to provide high-Tc superconducting ceramic oxide products which are sealed to prevent oxygen loss and loss of superconductivity.

Still another object of the present invention is to provide a macroscopic method for making high-Tc superconducting ceramic oxide products which does not require conventional wire and cable making techniques such as drawing and cold working.

It is still another object of the present invention to provide a macroscopic method for making high-Tc superconducting ceramic oxide products of a variety of shapes, sizes and configurations.

Yet another object of the present invention is to provide a method for making high-Tc superconducting ceramic oxide products whereby the superconducting ceramic oxide compositions are mechanically, electrically and chemically protected.

A further object of the present invention is to provide macroscopic and microscopic methods for producing high-Tc superconducting ceramic oxide products of high quality and having a long life.

Still a further object of the present invention is to provide a microscopic method for producing high-Tc superconducting ceramic oxide products.

Yet a further object of the present invention is to provide an apparatus and method for forming microscopic insulating layers or domains within a superconducting ceramic oxide thin film.

Another object of the present invention is to provide a method for making continuous superconducting connections between high-Tc superconducting products.

Another object of the present invention is to provide a method using alternate magnetic field during the heat treatment procedure for producing superconducting products, in order to destroy local magnetic moment, to accelerate oxygen to occupy $CuO_2$ plane position, and to orient $CuO_2$ plane to desire orientation dynamically.

These and other object of the present invention will be further understood by reference to the following detailed description and drawings, wherein:

BRIEF DESCRIPTION OF THE DRAWINGS

FIGS. 6A, 6B, 6C and 6D are cross-sectional views of embodiments of the high-Tc superconducting ceramic oxide products of the present invention having different shapes;

FIGS. 9, 10 and 11 are schematic illustrations of modified scanning tunneling machines, hereinafter referred to as STETMs (scanning tunneling electron treatment machines) useful in the microscopic method of the present invention;

FIG. 12 is a schematic cross-sectional view of a high-Tc superconducting ceramic oxide film provided with low oxygen content insulating domains produced by the microscopic method of the invention;

FIG. 13 is a schematic illustration of a SQUID made by the microscopic method of the invention;

FIG. 14 is a schematic illustration of an integrated circuit made by the microscopic method of the invention.

DETAILED DISCLOSURE OF THE INVENTION

Figure 1:
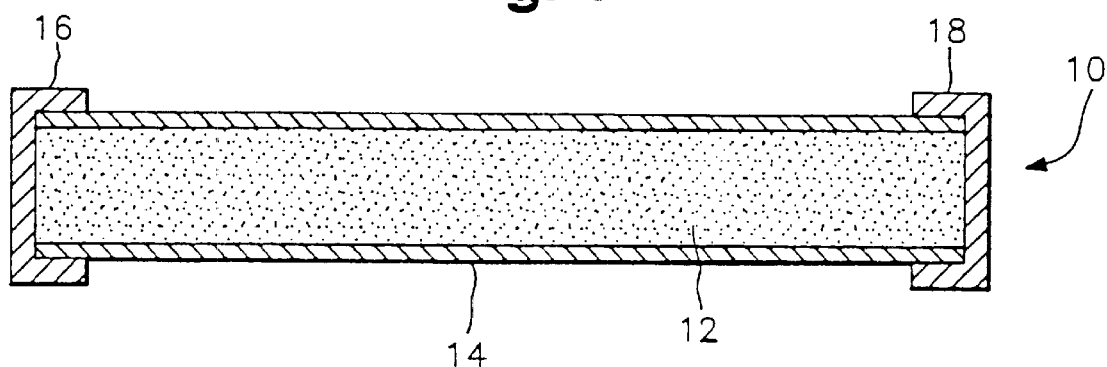
FIG. 1 is a cross-sectional view of a first embodiment of a sealed, high-Tc superconducting ceramic oxide product produced by the macroscopic method of the present invention.

Referring now to the drawing figures, and in particular FIGS. 1–7, there are shown several embodiments of a completely sealed, high-Tc superconducting ceramic oxide product of the present invention. Each of these embodiments is made by the macroscopic method of the invention. To produce the completely sealed superconducting products of FIGS. 1–7, the following macroscopic method is used.

First, the compounds or ingredients for making a high-Tc superconducting ceramic oxide composition are mixed together in powder form, by standard powder metallurgical techniques. For example, high purity $Y_2O_3$, $BaCO_3$ and $CuO$ powders are mixed together, without water content, to make the preferred high-Tc superconducting composition $YBa_2Cu_3O_X$. Then, the mixed powder is heated up to 940° C. in an unglazed ceramic crucible in a well ventilated oven for about 12 hours, and then cooled over a period of about 3 hours. The powder mixture is then kept at a temperature of about 450° C. for another about 3 hours and then cooled slowly to room temperature. After pulverizing and mixing the resultant powder, the same procedure is repeated for another 6 to 12 hours, with oxygen flowing through the oven. This procedure produces a high-Tc superconducting black colored powder. The powder is then reground a third time.

Known methods for preparing HTSC powder include the solid reaction method, in which HTSC metal oxides (e.g. BiO, SrO, CaO, CuO) are mixed together and milled until as uniform as possible a mixture is achieved. In addition, HTSC powders have been prepared by mixing HTSC metal nitrates (e.g. $Y(NO_3)_3$, $Ba(NO_3)_2$, etc.), heating to liberate nitric oxide gas, and the product oxidized HTSC powder which is then size classified in an effort to achieve uniformity prior to filling in a tube. However, these methods are inefficient and produce less than ideally chemically uniform HTSC powder.

In an improvement to known methods for preparing the HTSC powder for use according to the instant invention, impinging jets of $O_2$ are used to oxidize molten metal having the correct proportions of the HTSC metals. Thus, a molten mixture of, for example, Bi, Sr, Ca, and Cu is allowed to slowly stream spray or drip into a chamber equipped with at least one, and preferably a plurality of pressurized $O_2$ jets. As a result, the uniform molten metal mixture combines with the $O_2$, becomes oxidized, and forms a chemically uniform, oxidized HTSC powder for filling according to the instant invention.

This superconducting powder is then used in the macroscopic method of the present invention as follows. The superconducting powder is pressed into a tube or preform made of any suitable material which does not react with oxygen. The tube or preform may be made of a metal which does not react with oxygen or a plastic material. Examples of suitable materials which are inert to oxygen include stainless steel, copper and copper-nickel alloys, including $Cu_{90}Ni_{10}$ and $Cu_{70}Ni_{30}$ and others. The tube should be made of a material having a melting point higher than the sintering temperature of the high-Tc superconducting ceramic oxide being used, and generally the melting point of the tube material should be higher than 1000° C. Any material having a sufficiently high melting point can be used for the tube or preform. If the preform is made of a material which is not inert to oxygen, then a coating of a material inert to oxygen should be provided on the inner surface of the preform. Alternatively, a second tube of a material inert to oxygen could be nested within the preform to provide the necessary protection to the high-Tc superconducting ceramic oxide. Silver and silver alloys are especially preferred materials for use as an inner surface coating for the preform or for the nested inner tube. Of course, an inner surface coating or inner tube can be used with an outer preform made of a material inert to oxygen, in order to provide additional sealing and protection.

It is particularly preferred, according to this invention, to use a stainless steel outer body with a silver sheathing or silver coating layer. The non-apparent advantages of this particular embodiment of the invention are that upon applying pressure to the HTSC material, a more uniform HTSC is formed than when the entire sheath is comprised only of a soft metal, such as silver, which "flows" away from a pressure source. By providing a stainless steel cladding, externally applied pressure is more uniformly transmitted to the core of the HTSC powder, thus forming a more uniformly compact conductor. By, in addition, providing even a thin 1 micrometer ($\approx 1$ $\mu$m) layer of silver sheathing (or coating) between the stainless steel and the HTSC material the advantage of good interfacial HTSC formation is not lost. This advantageous aspect of the invention is applicable both to monofilament and multifilament HTSC wire or cable formation. Use of a hard, ductile high-temperature oxidation-resistant steel tube coated with silver by electrochemical methods both inside and outside is desirable. The inside coating has two purposes: one is to prevent the direct contact of superconductor to steel, the other is to provide a catalyst which is needed for the formation of the superconductor phase. The outside silver coating is to prevent too much oxidation of the steel during annealing.

The thickness of the silver coating is a very important factor in determining how much improvement can be achieved. When the coating is too thin, it cannot protect the superconducting core from contact with steel. But if it is too thick, it will be similar to just silver. Therefore, thicknesses from 1 to 10 $\mu$m are chosen, depending on desired $J_c$.

Figure 15:
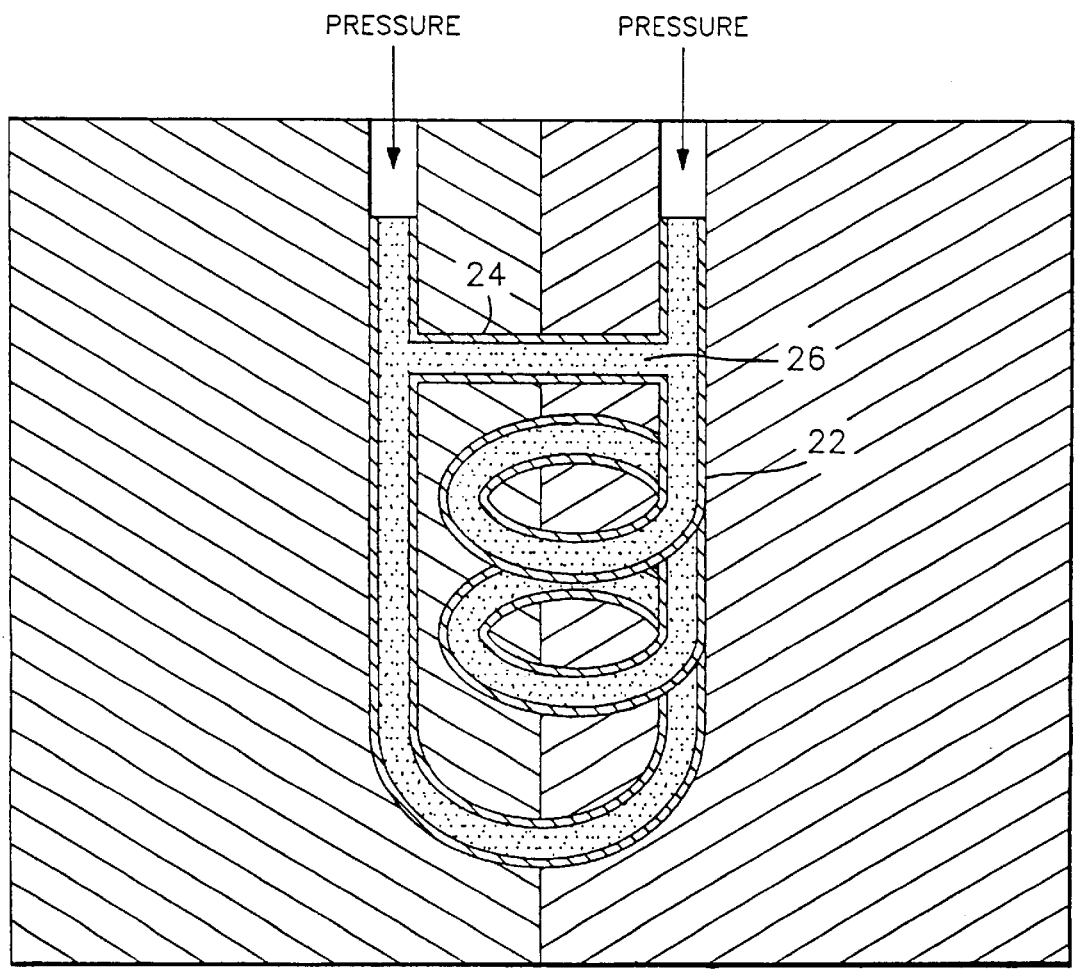
FIG. 15 is a schematic illustration of ceramic powder-containing hollow body in a casing suitable for pressurizing in accordance with the present invention.

A pressure sufficient to obtain a net pressure greater than about $5 \times 10^4$ psi is applied to the superconducting powder to ensure that the powder is completely pressed into the tube or preform with no vacant volume. It is to be understood that the steps of shaping the metal tube into a desired configuration and pressurizing the powder thereinto can be reversed. That is, the metal tube can be shaped into a desired configuration after at least a portion of the superconducting ceramic oxide powder has been pressurized therein. The applied pressure is selected to ensure that the desired density of the packed powder is obtained. For example, to obtain a density of about 5.0 grams/cm$^3$ of a YBa$_2$Cu$_3$O$_X$ or Bi-2223 powder, an applied pressure of $1.2 \times 10^5$ psi is used. This net pressure can be achieved using a mechanical press, liquid press, high pressure press and any high pressure technique can be used. To guarantee the required high net pressure, the packed tubes should be surrounded by a solid metal base such as surrounding base 200 shown in FIG. 15, very similar to the solid metal model for casting. The tube or preform having the packed superconducting powder therein, with the ends of the tube or preform being open, is then heat treated under conditions suitable to impart superconductivity to the high-Tc superconducting oxide. The exact conditions for heat treatment will depend on the type of high-Tc superconducting ceramic oxide being used.

Those skilled in the art will be able to determine proper heating and cooling conditions without undue experimentation. For a YBa$_2$Cu$_3$O$_X$ ceramic oxide, the heat treating comprises sintering the high-Tc superconducting ceramic oxide packed preform at a temperature between about 850° C. and 1030° C. for a time between about 0.1 and 100 hours in air; slowly cooling the high-Tc superconducting ceramic oxide packed preform to between about 450° C. to 600° C. and maintaining it at this temperature for about 1 to 100 hours with an O$_2$ flow; and then slowly cooling to room temperature. As another example, for a (Bi, Pb)$_2$Sr$_2$Ca$_2$Cu$_{3X}$ ceramic oxide, the sintering conditions will be a temperature of about 830° C. for 1 to 150 hours, followed by a slow cool in low oxygen pressure (about 5% to 20% O$_2$ plus 95% to 80% argon or nitrogen gas) or any air environment containing O$_2$.

In a preferred embodiment, the packed tube or preform with YBa$_2$Cu$_3$O$_X$ therein is heated in a furnace or oven from room temperature to 940° C. over a period of about 3 hours and then is maintained at a temperature of about 940° C. in air for about 6 hours. An O$_2$ flow is then started through the oven or furnace and the sample is gradually cooled to 550° C. over a period of about 10 hours, and then is cooled to a temperature of about 200° C. over another period of about 10 hours while maintaining the O$_2$ flow, and then slowly to room temperature, again with the O$_2$ flow, over another 10 hour period of time. If the preform is a complicated shape rather than a simple tube, apertures may be opened in the preform in addition to the open ends thereof, to guarantee oxygen flow through the entire product. These apertures are resealed after sintering is completed.

The thus sintered product is then tested for zero resistance and for the Meissner effect. The sintered product thus having demonstrated superconductivity, the ends of the tube or preform are sealed to prevent oxygen loss and complete production of the completely sealed high-Tc superconducting ceramic oxide products of the present invention.

Figure 8B:
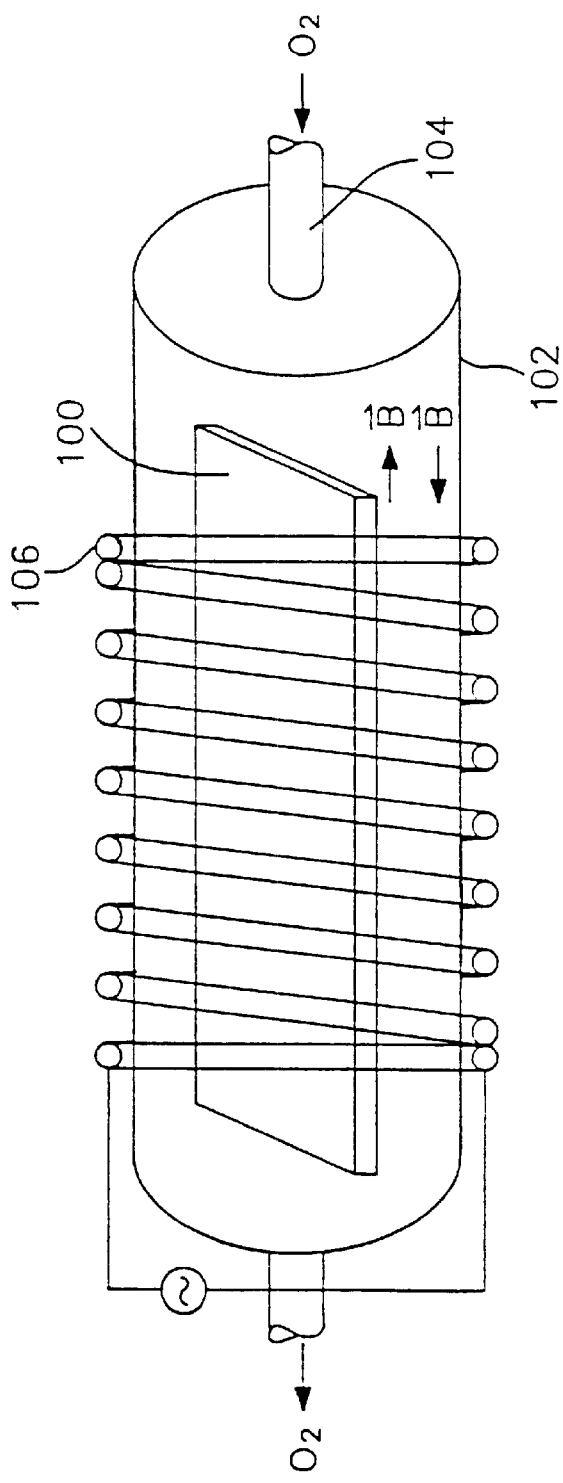
FIGS. 8A and 8B are schematic illustrations of the sintering of a high-Tc superconducting ceramic oxide macroscopic product and thin film, respectively, in an alternate magnetic field according to the macroscopic and microscopic methods of the present invention, respectively.
Figure 8A:
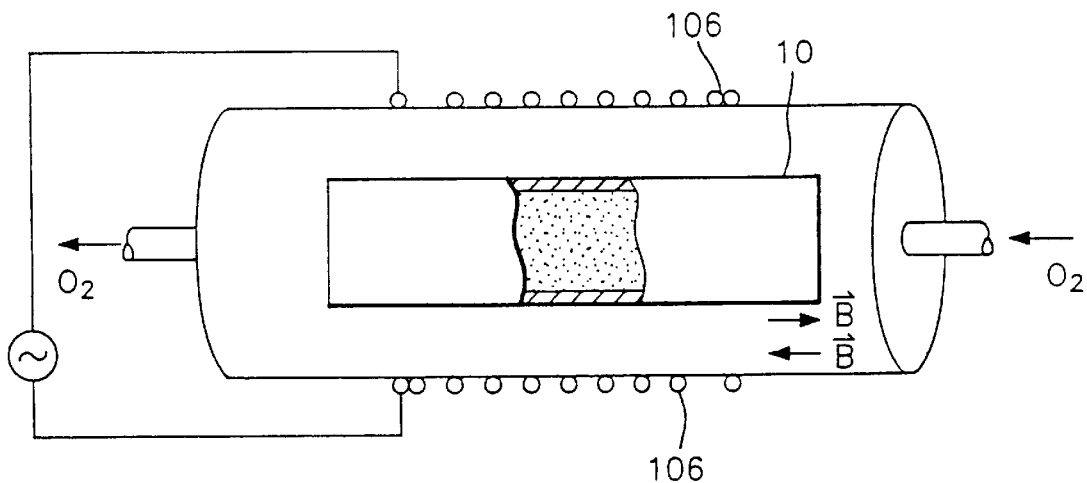

With more particular reference to the drawing figures, the completely sealed high-Tc superconducting product 10 of FIG. 1 is produced as follows. A superconducting ceramic oxide powder 12 is pressed into a tube 14 at a pressure greater than $1.2 \times 10^5$ psi; the packed tube is then sintered in an oxygen atmosphere as detailed above, preferably silver coated with the oxygen flowing at a rate great than 1 atmosphere; and then end seals 16, 18 are applied to the open ends of the tube 14 of the sintered product to effect the complete seal. An alternate magnetic field can be applied during the heat treatment period as shown in FIG. 8A. Prior to sealing the ends of the tube 14, the high-Tc superconducting properties of the product are verified or determined as discussed above. The end seals 16, 18 may be applied by any known means which are effective to ensure a fluid tight seal, for example, welding or screw sealing endcap. The tube 14 may have any desired cross section, such as circular, rectangular or square, depending upon the desired end use of the superconducting product. Local heating can be used to make superconducting connections between superconducting products or leads, under certain pressures and in oxygen or air environment, electrical heating or any other local heating can be used.

Figure 2:
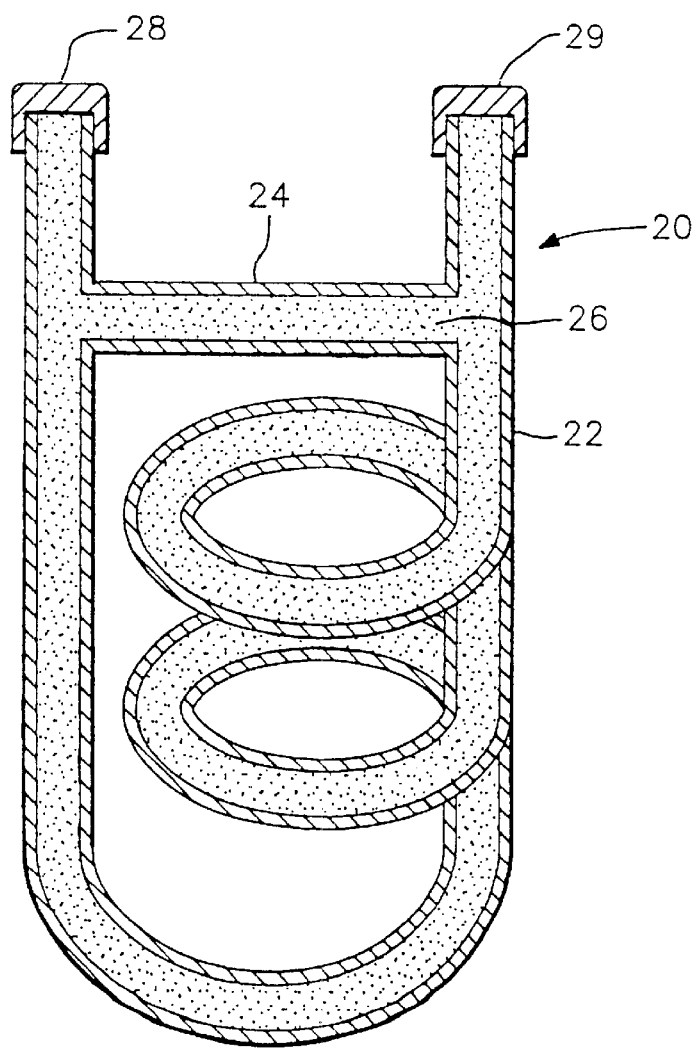
FIG. 2 is a cross-sectional view of a second embodiment of a sealed, high-Tc superconducting ceramic oxide product (high-Tc superconducting magnet) produced by the macroscopic method of the present invention.
Figure 3:
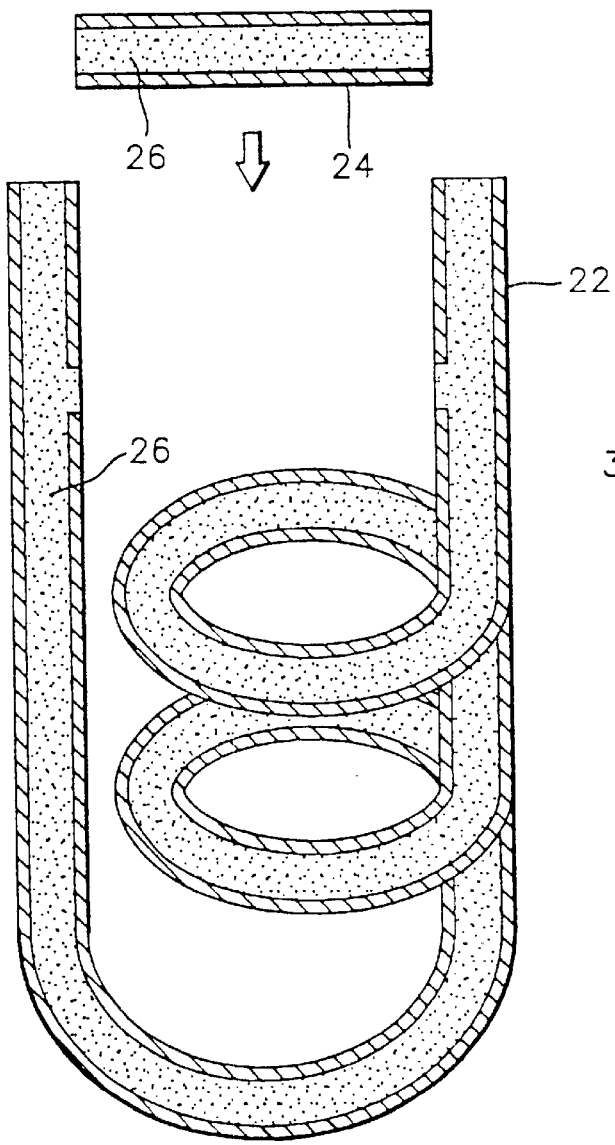
FIG. 3 is an exploded, cross-sectional view of the components for producing the superconducting product (high-Tc superconducting magnet) shown in FIG. 2.

The macroscopic process of the present invention also provides a simple method for producing high-Tc superconducting ceramic oxide products of various shapes, including complicated and composite shapes, as illustrated in FIGS. 2 through 6C. FIGS. 2 and 3 illustrate, respectively, a high-Tc superconducting magnet produced according to the present invention, and the component parts thereof. The high-Tc superconducting magnet shown in FIG. 2 provides a complete, continuous superconducting loop without any welding, soldering or pressing joints after making. To produce the superconducting magnet product 20 shown in FIG. 2, two metal, preferably silver coated stainless steel, tubes 22, 24, which do not react with oxygen, are provided and tube 22 is wound into an appropriate coiled configuration. Next, the high-Tc superconducting ceramic oxide 26, in powder form, is pressurized at a pressure of at least $1.2 \times 10^5$ psi in each of the metal tubes 22, 24.

It is to be understood that the steps of shaping the metal tube into desired configuration and pressurizing the powder thereinto can be reversed. That is, the metal tube can be shaped into a desired configuration after at least a portion of the superconducting ceramic oxide powder has been pressurized therein. One example of the reversed procedure is as follows. A high-Tc superconducting ceramic oxide, in the form of a powder or a pellet having a density greater than 75% of ideal, is pressed into a metal tube to form a continuous body. Then the metal tube with the high-Tc superconducting ceramic oxide therein is heated above the softening point of the metal tube material, generally between about 100° and 800° C., but below the sintering temperature of the high-Tc superconducting ceramic oxide. After heating the metal tube above its softening point, the metal tube with the high-Tc superconducting ceramic oxide therein can be bent into any desired shape, such as the coil shape shown in FIGS. 3 and 6D.

After the superconducting ceramic oxide powder has been pressurized into each of the metal tubes 22, 24, the tubes 22, 24 are assembled, as shown in FIG. 3, to form the desired complicated shape of the superconducting magnet 20. Metal tube 24 is joined to metal tube 22 by any suitable means, such as by welding or any other tube connection method.

After the metal tubes 22, 24 have been joined, the powder is again pressurized under a pressure between about $5 \times 10^4$ psi and $1 \times 10^7$ psi to make a continuous connection without any gap in the entire tubular structure of the product, to safeguard against gaps between tube 22 and tube 24 and potential oxygen loss. This repressurizing of the superconducting ceramic oxide powder ensures that there is a continuous connection through the joints where the subparts, i.e., metal tubes 22, 24, have been joined to make the final shape.

Then, the preform having the packed superconducting powder therein is sintered, as described above, in an oxygen atmosphere. For a complicated shape such as that of the superconducting magnet shown in FIG. 2, it is preferable that some apertures or windows be opened in the metal tubes 22, 24 to ensure that oxygen flows throughout the entire body. After the high-Tc superconducting properties of the sintered product have been checked, the product is completely sealed by resealing the apertures or windows, if any, and completely sealing the ends of the metal tube 26 with endcaps 28, 29.

In the preparation of HTSC magnets, particularly for such applications as MRI, it is highly desirable that as uniform as possible magnetic field be produced. In addition, since high temperature superconductivity is antagonized by perpendicular components of magnetic fields, it is highly desirable to maintain the induced magnetic field, as much as possible, in a direction "ab" plane parallel to the "ab" plane of the HTSC of the magnet.

Both of these objectives are achieved herein by the expedient of deploying an HTSC ring or "donut" at either end of the HTSC magnet windings, with the center of the ring encompassing the exit of the magnet windings at either end of the HTSC magnet coils. In this fashion, the Meissner effect is used to advantage to act as a "clamp" for the induced magnetic field, extending the distance by which the magnetic field remains homogenous and parallel to the "ab" plane of the HTSC material forming the HTSC magnet.

Figure 5:
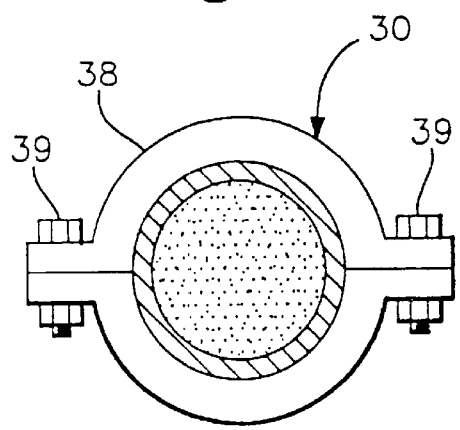
FIG. 5 is a cross-sectional view of a sealed connection, taken along line V—V of FIG. 4.
Figure 4:
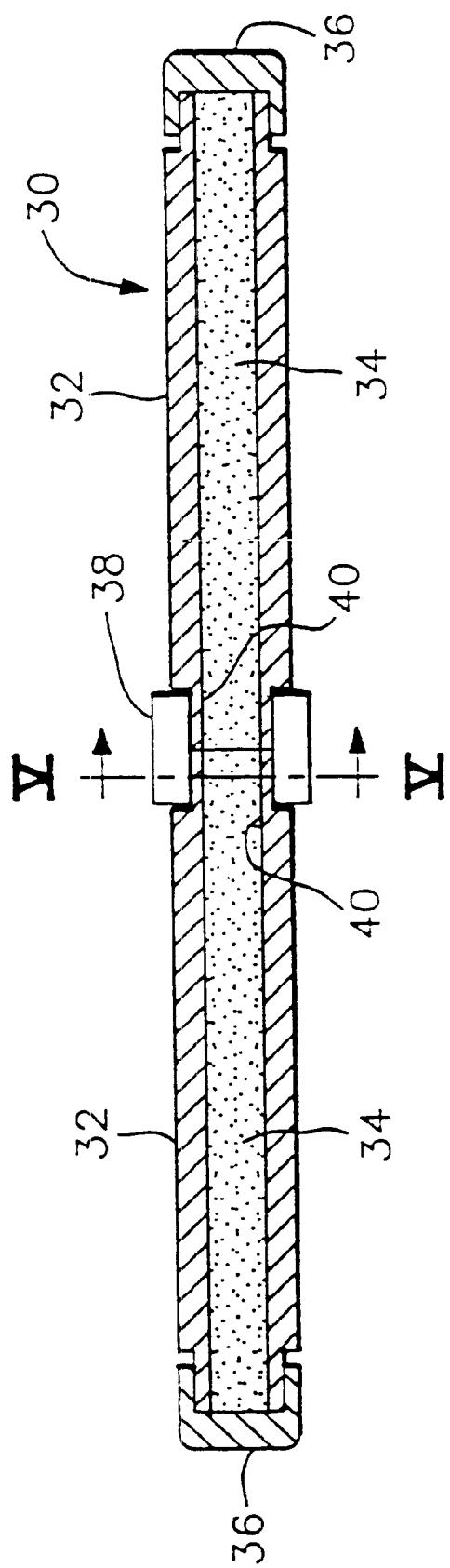
FIG. 4 is a cross-sectional view of a third embodiment of a sealed, high-Tc superconducting ceramic oxide product produced by the macroscopic method of the present invention.

Referring now to FIGS. 4 and 5, there is shown a superconducting ceramic oxide product made by joining or connecting, in end-to-end relation, two sintered products similar to the sintered product 10 shown in FIG. 1. More particularly, as shown in FIG. 4, two sintered products, each having a tube 32 with sintered superconducting ceramic oxide powder 34 pressed therein and sealed at one end with an endcap 36 are joined by connector 38. Connector 38 surrounds the adjacent ends of the tubes 32 and the connector 38 is held together using screws 39, as shown in FIG. 5. Alternatively, or in addition to the screws 39, the connector 38 may be provided with internal threads and the ends 40 of the tubes 32 may be provided with mating screw threads so that the ends 40 of the metal tubes 32 may be screwed into connector 38. Two sintered products, such as those shown in FIG. 4, can also be joined by local heating according to this invention. High-Tc superconducting ceramic oxide powder, of the same type as in the products to be joined, is inserted between the two portions of the sintered products to be joined. The two products to be joined are then pressed together, with the addition high-Tc superconducting powder therebetween at a pressure between about $5 \times 10^4$ psi and $1 \times 10^7$ psi. Then the joint is subjected to a local heat treatment under conditions appropriate to render the joint superconducting. For example, if the joint is produced from a $YBa_2Cu_3O_X$ ceramic oxide, the joint is heated locally so that the joint is sintered in oxygen or air at a temperature of about 1000° C.+30° C., gradually cooled to about 550° C., annealed at about 550° C. for about 10 hours in oxygen or air, cooled to room temperature and then tested for superconducting properties. For Bi-2223 material, joint sintering is conducted at a temperature of about 830° C. to 840° C. After the superconductivity of the joint is confirmed, the joint can be sealed by soldering, welding, screwing or any other available sealing method which will protect the joint from exposure to oxygen.

FIGS. 6A, 6B, 6C and 6D show additional shapes of sintered products which may be made by the macroscopic method of the present invention, as described above. High-Tc superconducting ceramic oxide product 50 of FIG. 6A, comprises a tube 52 having sintered superconducting ceramic oxide powder 54 pressed therein and having endcaps 56, 58 provided on the ends of the tube 52. Superconducting ceramic oxide product 50 is made by the macroscopic method described above. In making this product, the tube 52 may be bent to the 90° angle shown before or after pressurizing of the powder 54 therein. High-Tc superconducting ceramic oxide product 60 shown in FIG. 6B has a T-structure which is particularly suitable for making T-connections in superconducting products. The T-superconducting ceramic oxide product 60 shown in FIG. 6B comprises a metal tube 62, sintered superconducting ceramic oxide 64 and endcaps 66, 67 and 68. The T-shaped superconducting product 60 can be made by providing a tube, such as a metal tube, having a T-shape or by joining two straight tubes, as discussed with respect to FIGS. 2 and 3, to form the T-shaped structure.

FIG. 6C shows a completely sealed, four-way superconducting connector produced by the macroscopic method of the present invention. The four-way connector 70 comprises a tube 72, a sintered superconducting ceramic oxide 74 and endcaps 76, 77, 78 and 79. The four-way superconducting connector 70 can be made by providing a four-way tube or by joining two tubes centrally and substantially opposite one another on opposite sides of a single tube to form a continuation superconducting four-way connector.

Although these embodiments have been described primarily with reference to joining two straight preforms, it is to be understood that more than two preforms and preforms having different configurations such as curved shapes can be joined in accordance with this invention. Any number of bodies of any configuration can be joined to form multi-joint structures.

Figure 6D:
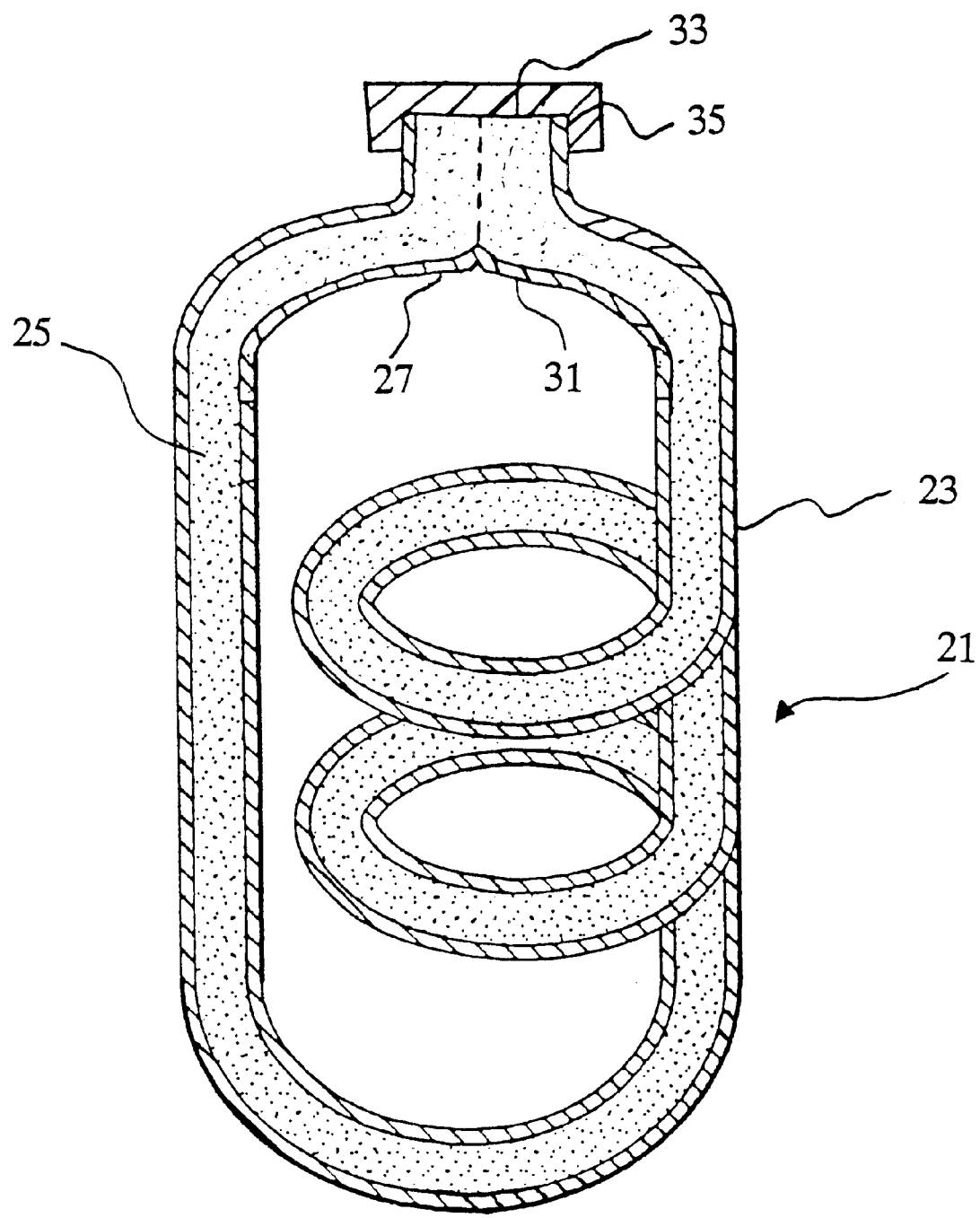

FIG. 6D shows another embodiment of the invention, in which two ends of one preform are joined to form a continuous loop structure 21. To form structure 21, longitudinal portions of a tube 23 are removed along the two ends thereof, after the tube 23 has been filled with high-Tc superconducting ceramic oxide powder 25. Then the open longitudinal portions of the tube 23 are pressed together, with the ceramic oxide powder 25 therebetween, and/or the two ends are joined and the ceramic oxide powder repressed thereinto from the open top, to form a complete loop. The portions 27, 31 of the tube are joined together by any suitable means and then the structure is subjected to a suitable heat treatment with the end 33 of the loop structure open, as described above, to sinter and anneal the high-Tc superconducting ceramic oxide powder. After testing the superconductivity of the sintered ceramic oxide powder, the end 33 is sealed with a cap 35 or other suitable sealing means.

Figure 7:
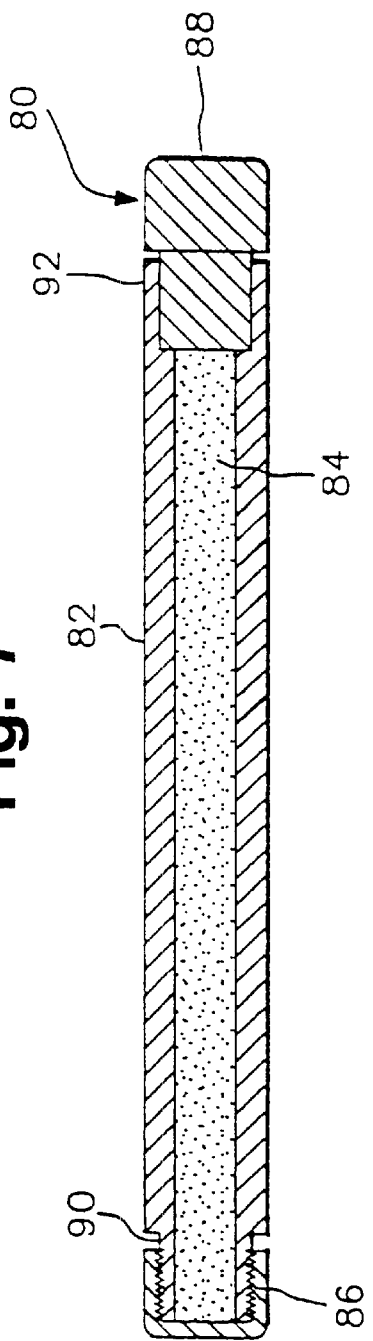
FIG. 7 is a cross-sectional view similar to FIG. 1, showing different end seal connections.

Referring now to FIG. 7, there is shown an alternate method of sealing the ends of a tube containing a sintered high-Tc superconducting ceramic oxide. The superconducting product 80, shown in FIG. 7, comprises a tube 82, a sintered superconducting ceramic oxide 84, an endcap 86 and an end sealing means 88. A first end 90 of the tube 82 is provided with internal threads which matingly engage endcap 86, which endcap is a female screw connector. End 92 of tube 82 is provided with internal threads and matingly engages female screw connector 88.

Although several different embodiments of a superconducting ceramic oxide product produced by the macroscopic method of the present invention have been described in detail above, it is to be understood that other shapes, configurations and sealing arrangements are contemplated within the scope of the present invention. In addition, modifications to be macroscopic process described in detail above may be made as necessary to adapt the process to superconducting ceramic oxides other than those specifically disclosed. Further, additional process steps may be employed together with the steps of the macroscopic process detailed above. For example, the sintering of the superconducting ceramic oxide powder may be conducted in an alternate magnetic field ($10^{-4}$ Tesla to 300 Tesla), as shown in FIG. 8A, to ensure high current density. Further, after long time use of the superconducting ceramic oxide products of the present invention, these products can be resintered in an oxygen atmosphere and resealed so that they can be used for another lengthy period of time.

In accordance with the principles of the invention, completely sealed superconducting products of various configurations can be made by depositing a high-Tc superconducting ceramic oxide material on the outer surface of a high melting material preform, preferably metal, which is inert to oxygen, subjecting the coated preform to an appropriate heat treatment to sinter and anneal the high-Tc superconducting ceramic oxide thereby making it superconducting, and then sealing the sintered high-Tc superconducting ceramic oxide layer with a coating of a metal which is inert to oxygen or with an insulator which is inert to oxygen and is inert to HTSC materials. In this embodiment of the invention, the high-Tc superconducting ceramic oxide material can be deposited on the preform by any suitable means, including, but not limited to: immersing the preform in a suspension of the high-Tc superconducting ceramic oxide or in the liquid state of the high-Tc superconducting ceramic oxide; chemical vapor deposition, such as molecular chemical vapor deposition; electron beam deposition; sputtering; laser ablation deposition; and the like. Preferably, the high-Tc superconducting ceramic oxide material is deposited on the outer surface of the preform to form a continuous, substantially uniform layer having a thickness of between about $10^{-1}$ and $10^4$ micrometers.

Referring now to FIGS. 8B through 14, the microscopic method of the present invention, and the superconducting ceramic oxide products produced thereby will be explained. The microscopic method comprises the steps of: forming a thin film of a high-Tc superconducting ceramic oxide composition by a known deposition technique such as electron beam deposition, sputtering deposition, molecular beam deposition, laser ablation or any other suitable method, optionally with an alternate magnetic field being applied during the film making process in situ or during the sintering process after film making to upgrade the quality of the thin film; and removing partial oxygen content from a microscopic domain of the thin film superconducting ceramic oxide by warming up the microscopic domain using a modified scanning tunneling microscope referred to hereinafter as an STETM (scanning tunneling electron treatment machine). Before STETM treatment, the insulator substrate upon which the thin film is initially formed must be removed, and then the high-Tc film supports itself or is coated with a supportive conductive layer. After the STETM treatment, the thin film is sealed with a suitable sealing layer to protect the separation of the low oxygen domain and the high oxygen domain. If a thin conductive substrate is used for the thin film making, it need not be removed before STETM treatment.

The thin film as deposited can be superconducting or, optionally, the thin film can be sintered under conditions very similar to those described above with respect to the macroscopic methods, in order to produce a high-Tc superconducting thin film. Preferably, such sintering takes place in an alternate magnetic field as illustrated in FIG. 8B. The required characteristics of the magnetic filed are alternate magnetic filed waveforms in the range from $10^{-4}$ Tesla to 300 Tesla. If the thin film is deposited on a substrate, the substrate may be of any suitable dimension, e.g., from $10^{-6}$ m to 1 cm in thickness. The substrate can be any oxide material except a CuO system. For example, the substrate could be an AlO or MgO system. The thin film generally has a thickness of from about 30 Å to about 10 $\mu$m, preferably between about 100 Å and 1000 Å.

Figure 9:
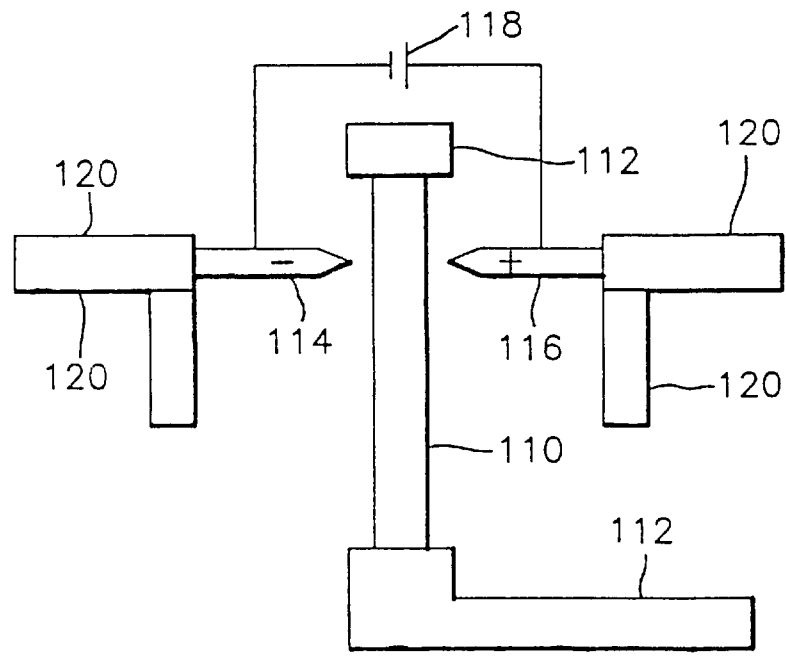
Figure 10:
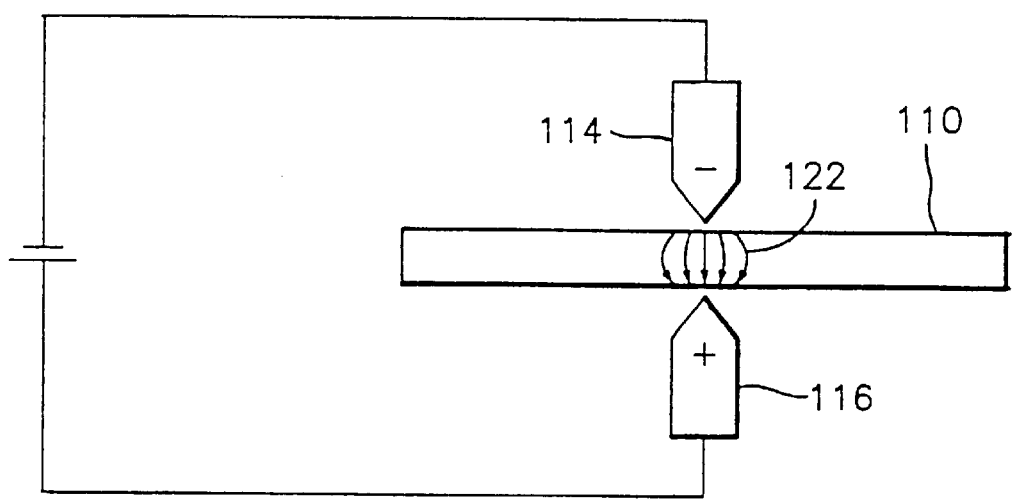

The STETM useful in practicing the microscopic method of the present invention is a modified STM having two tips opposite one another as shown in FIGS. 9 and 10, or having two opposed boards, each provided with a plurality of opposed tips as shown in FIG. 10. AC or DC current is passed between the opposed tips to locally heat up a microscopic domain having a size from about 5 Å to about 1000 Å. In the present invention, a thin high-Tc superconducting oxide film is held between the two tips or two boards of tips. When two tips are close to the film, the AC or DC current passing through the tips turns on a local domain or about 5 Å to 20 Å, to heat the thin film locally thereby removing oxygen content locally as desired. The opposed tips can be moved independently of one another or together with one another, as determined by a program controlling such movement. Although FIGS. 9 through 11 show a DC current source, it is to be understood that an AC current source could be substituted therefor. The current can be from about $10^{-6}$ Amps to about 100 Amps, depending on the type and thickness of the thin film and any supporting (conductive) substrate. The microscopic domain is heated to a temperature of between 200° and 900° C. in an argon atmosphere to remove the oxygen content of that microscopic domain and form a microscopic insulating domain.

The microscopic method of the present invention enables one or more microscopic insulating domains each having a size of between about 5 Å and 1000 Å to be formed in the superconducting ceramic oxide thin film. The microscopic insulation layers or domains between the high-Tc superconducting domains form Josephson junctions for SQUIDS or any high-Tc superconducting electric circuit. Compared to a 5000 Å insulation in a semiconductor, high-Tc superconducting microscopic circuits produced by the present invention can save space by a factor of $10^2 \times 10^2 \times 10^2$ for 3D circuits and $10^4$ for 2D circuits.

After the STETM treatment, the microscopic insulation layer is in a stable state and the adjacent superconducting domains are in a metastable state, and therefore, a potential barrier of oxygen molecules is established between the two states. The microscopic film containing the superconducting domain and the insulator domain is then completely sealed by applying a suitable coating sealing layer over the film, such as the sealing layer shown in FIG. 12. After wire connections are applied to the thin film structure as desired, the whole film is sealed except the wire. Therefore, the film, which contains superconducting and nonsuperconducting domains, will be sealed by the coating sealing layer. The $O_2$ content and the domain separations are thus protected by the sealing for long life. The oxygen content of the superconducting domain has nowhere to go because diffusion to the insulation domain requires excitation energy, which forms a potential barrier to separate the superconducting and insulating domains. Therefore, the sealed high-Tc superconducting chips exhibit long life. Liquid nitrogen or low noise refrigeration will guarantee the operation of the high-Tc superconducting circuits.

Referring now to FIG. 8B, there is shown the sintering of a superconducting thin film ceramic oxide in an alternate magnetic field. The thin film 100 is sintered in furnace 102 in an oxygen atmosphere, with oxygen flowing into the furnace 102 through conduit 104. An alternate magnetic field is applied in the B direction by magnet solenoids 106.

FIG. 9 schematically illustrates the STETM treatment of superconducting thin film ceramic oxide 110 in accordance with the microscopic method of the invention. The thin film 110 is supported by support 112 such that the thin film 110 is substantially perpendicular to pins 114, 116 of the STETM. Pins 114, 116 are connected to electric current source 118, with pin 114 having a negative potential and pin 116 having a positive potential or an alternate AC potential. Each of the pins 114, 116 is supported by three mutually perpendicular or orthogonal piezoelectric sticks 120, extending in the X, Y and Z directions. The pins can move independently or dependently by programming as desired. The current can be $10^{-6}$ Amp to 100 Amp. Voltage can be $10^{-3}$ V to $10^4$ V, depending on the material, thickness and the like. Treatment by a pair of opposed pins can be localized to 5 Å or even smaller, and treatment by opposed boards each having a plurality of pins can be as large a 1 $\mu m^2$. The tips and boards can be made of tungsten, platinum, gold, and compounds thereof, as well as other suitable materials.

FIG. 10 schematically shows the flow of electrons 122 from the negative pin 114 to the positive pin 116 through the superconducting thin film 110 to remove oxygen content and form the microscopic insulating domain. FIG. 11 shows an alternative embodiment of the STETM wherein a plurality of opposed positive pins 126 and negative pins 124 are provided to simultaneously form a plurality of microscopic insulating domains in the thin film superconducting ceramic oxide 128.

FIG. 12 illustrates a superconducting thin film ceramic oxide product 130 produced by the microscopic method of the present invention. The superconducting thin film ceramic oxide product 130 comprises a plurality of microscopic insulating domains 132 between adjacent high-Tc superconducting domains 134. A sealing layer 136 is provided around the superconducting thin film ceramic oxide to prevent loss of oxygen from the superconducting domains and to prevent the resultant loss of superconductivity and protect the separation between the superconducting and nonsuperconducting domains. Because the potential barrier is sealed and isolates the areas surrounding it, no excitation energy can be provided to overcome the potential barrier and the superconductivity circuit has a long lifetime. The sealing layer is an insulating coating layer which is inert to oxygen and can be applied by any suitable means, such as spraying, coating, immersion, and the like. Elements 137 are wire connections.

Finally, FIGS. 13 and 14 illustrate, respectively, a SQUID 150 made by the microscopic method of the present invention and an integrated circuit 160 made by the microscopic method of the invention. More specifically, FIG. 13 shows a SQUID 150 having a high-Tc superconducting loop 152 and a Josephson junction 154 which can be as small as 5 Å to 20 Å (i.e., close to the coherence length of about 5 Å on $CuO_2$ plane) formed by the microscopic insulating domain. The microscopic process of the present invention is unique in that it can make such small and accurate high quality SQUIDs. The SQUID of FIG. 13 is made from a high quality high-Tc superconducting film. The film is held in the STETM and a superconducting ring is masked. The remainder of the film area is treated by the STETM to remove oxygen content and form an insulating area or domain. A Josephson junction is then made by the STETM treatment of the desired areas of the remaining superconducting ring. A wire connection 170 is then made and the whole film structure is sealed except the wire connection.

FIG. 14 shows an integrated circuit 160 comprising insulating layers or domains 162 and high-Tc superconducting domains 164. The integrated circuit 160 is similarly made by treating a thin high-Tc superconducting film with the STETM to produce a desired pattern of insulating domains 164 and superconducting domains 162; affixing wire connections 174 to the resultant structure; and then sealing the structure with the exception of the wire connections.

In addition to the foregoing macroscopic and microscopic methods, several additional methods are relevant to the instant invention. These relate to methods of creating joints in multifilament wires; to electrophoretic deposition methods and multi-rolling methods for creating extremely long HTSC wires an to avoid or reduce "sausage" and "crack" problems; and to novel compositions and methods of enhancing $J_c$ by creating pinning centers in the HTSC to prevent creeping of magnetic flux which produces resistivity. These methods and their products are described in turn below.

Multifilament joints. An HTSC joint that can connect HTSC conductors and has a critical current, $J_c$, of 10,000 Amp/cm$^2$ and a resistance of a nano-ohm or less at 77K will permit the fabrication of extremely long conductor lengths and pave the way for practical HTSC devices such as solenoids, motors, magnets power transmission cables and energy storage devices.

Commercially available HTSC conductors are typically monofilament or multi-filament wires made by the react and winding method or winding and reacting method. To date no HTSC joint technology has been developed to connect multi-filament conductors together. An HTSC joint such as the one proposed here could lead to the development of unlimited length HTSC conductors.

There are two difficulties encountered in fabricating high $J_c$ HTSC joints:

1) After sintering heat treatment, the hardness and brittleness of the wire and tape makes it difficult to form a low resistance joint.

To overcome this difficulty, my approach is to add extra soft raw powder between the two ends of the joint position. For example, two broken pieces of ceramic cannot form a seamless joint. By introducing extra soft powder to the joint during formation, the powder can fill all of the voids and discontinuities to produce a seamless and therefore low resistance joint. After heat treatment, a seamless continuous joint is formed.

2) Alignment of multi-filament connectors when forming joints:

It is difficult if not impossible to perfectly align the individual conductors of a multi-filament wire so that good connections and therefore a good joint can be made. My approach to solving this problem is as follows:

(1) Remove a few mm of the silver cladding to expose HTSC conductor from both ends of the multi-filament conductor to be joined.

(2) Load the two exposed ends into a metal die set and insert extra fresh powder in between the two exposed ends.

(3) Apply high pressure to join the two ends with the fresh raw powder.

(4) Perform the final heat treatment and if needed roll and press the joint and repeat the heat treatment process until a high $J_c$, low resistance joint is formed (i.e. sintering).

(5) Seal the outside silver cladding.

Thus, this multifilament joint technology may be applied to achieve certain unexpected advantages. A cable of increased flexibility, as compared to an HTSC monofilament cable, may be obtained. In addition, the multifilament has the advantage that if one or even several of the filaments of the multifilament cable were to crack, HTSC function is not impaired, whereas in the monofilament cable, a crack may completely impair current flow. A further, unexpected finding is that the multifilament joint of this invention is capable of carrying a superconducting current with essentially zero resistance.

In preparing the multifilament joint, it may be desirable to form male-female interlocking cable pieces such that a small amount of HTSC powder may be placed between the opposing pieces of multifilament to be joined. The ends of multifilament tape or wire with the HTSC powder is the placed in a die, and are pressed together, then heated and sealed as described above. A low resistance, $10^{-9}$ ohm, high current density, $J_c \geq 10^4$ amp/cm$^2$, joint results. This is different and superior to the HTSC joint taught in U.S. Pat. No. 5,051,397 which teaches the use of Indium alloy as a connecting medium between two HTSC conductors forming a HTSC-LTSC-HTSC joint. While this technique may work at 4 K, it certainly will not work at 77 K. Norimitsu and Yoshiharu have tried to use a hot press to diffuse BSCCO thick films and BSCCO pellets respectively; Yoshiharu Mutoh has applied high pressure at 1,100° C. to form a HTSC joint. This technique is not practical for silver cladded HTSC conductors since silver melts at 960° C.

J. E. Tkaczyk et al. tried to join reacted BSCCO tapes. The resistivity of these joints were $10^{-8}$ Ohms, far too high for a practical joint. The current density achieved with these joints was only half that of the unjoined conductor. This is because the raw material is needed to form a good joint.

Thus, the technique of the subject invention to form joints with raw tapes (before sintering) or to join tapes after sintering by using raw powder as the joint material represents a breakthrough in HTSC joint technology, which may now, according to the instant disclosure, be applied to the preparation of joints in multifilament HTSC wire or tape.

Thick Film Electrophoretic deposition Methods. With respect to electrophoretic deposition of HTSC thick films (1 μm–100 micrometer) methods, followed by rolling methods for creating extremely long HTSC wires, a continuous HTSC tape manufacturing method comprises continuous electrophoretic deposition and rolling, resulting in a high mass density, high alignment and high $J_c$ completely sealed HTSC tape, with silver or alloys inert to $O_2$ or with metal coated with Ag such that the HTSC material is sealed in the core. Reference is made here to the disclosure above where deposition is achieved by immersing a preform in a suspension of high-Tc superconducting ceramic oxide or in the liquid state of the high-Tc superconducting ceramic oxide. HTSC materials that may be deposited in this fashion include BSCO-2223, BSCCO-2212, BPSCCO-2223, BPSCCO-2212, YBCO-123 and Tl based systems and any HTSC materials having a thickness of deposition about 1 μm–1000 μm. According to this method a tape, such as silver tape, with a thickness from 10 μm to 5 mm is passed through an electrophoretic bath containing HTSC powder in acetone or like solvent. Above the tape, a cathode is applied and an anode below. In this fashion, as the tape is fed through the bath, HTSC material is deposited on one side of the tape. Two tapes, treated in this manner are then brought together with the deposited HTSC materials facing each other, and sealed as described in greater detail below. To ensure proper deposition of the HTSC material, the Ag tape may be coated along the outer edges with a polymer or plastic which can be removed before the rolling process. This is called mechanical alignment method. This method can make very long length HTSC tape, as opposed to the PIT method which has severe length limitations. This will allow the edges of the tape to be sealed as described below, without HTSC material interference. This method is much better than the method suggested by Woolf et al., as they use an electrophoretic coating method for depositing HTSC on an Ag core. This process is repeated several times to form a multilayer, co-axial cable; followed by rolling to form a flat tape. However, the approach suffers from high costs and low quality of silver layer deposition layers, resulting in low density, poor mechanical properties, poor alignment of HTSC materials, and low $J_c$. By contrast, this disclosure provides high quality, high density tape at low cost, therefore resulting in good alignment in HTSC material, because high quality high density Ag tape can be used to transfer the pressure to HTSC material to form good alignment to increase $J_c$.

In a similar fashion, three nested tapes composed, for example, of Ag are fed into an electrophoretic bath containing HTSC powder in acetone or like solvent. The upper and lower tapes are positively charged (i.e. connected to a cathode) and the middle tape layer is negatively charged (i.e. connected to an anode). The tapes are fed through the bath and into a roller for sealing. As the tapes pass through the bath, HTSC material is deposited on the upper and lower surfaces of the negatively charged tape, and, as the tapes are passed in register with each other through the rollers, the upper and lower layers are compressed onto the middle layer, thereby forming a seal around the HTSC material deposited on the middle tape. The edges of the upper and lower tapes may be further sealed by heating or welding or by electrical discharge. The resulting tape has a long length and high $J_c$. The same method as described above may be applied to production of a multilayer HTSC material by using several intermediate negatively charged tapes. The upper and lower tapes are therefore preferably dimensioned such that, upon rolling, there is extra material to extend the sealing layer all around the intermediate multilayers of HTSC.

Multi Rolling Process with Driving (active) Roller dies for HTSC Wire Making. This method overcomes the many disadvantages encountered by drawing HTSC wires which causes breakage and inhomogeneity of the brittle HTSC ceramic. In addition, this method improves on and is distinguishable from the method of U.S. Pat. No. 5,304,602 in that the method of that patent requires the use of roller dies for drawing a monofilament wire containing HTSC materials in which the roller dies are driven by HTSC wires which are pulled (no pushing force), and the roller dies are passive. This driving process cannot eliminate "sausage" and "crack" problems because there is no pushing force to push the HTSC material thorough the die. The metal sheath will move through faster than the HTSC materials. Thus, a disadvantage of that method is the formation of an extruded outer shell which flows more quickly than does the contained HTSC material. In addition, the inventors of the U.S. Pat. No. 5,304,602 patent were concerned with reaction of their ceramic with the metal pipe during sintering (see column 4, line 63 to column 5, line 2). This concern is overcome in the total invention described herein which comprises provision of an inert sheathing, such as silver between the HTSC and stainless steel pipe of the monofilament and the provision of an inert sheathing, such as silver, for the powder in tube method and for the electrophoretic deposition and rolling method described immediately herein above.

With respect to the rolling portion of the instant method, a further improvement is the provision of motor, gear, or otherwise driven rollers which, by the very nature of the motorized rotation of the rollers, feeds the HTSC tape or wire into and through the roller dies. This will provide a large pushing force to the HTSC material, to make the speeds of transport of the HTSC materials and metal similar, to avoid "sausage" and "cracks". I call this the active roller die method. This is a further distinction to the U.S. Pat. No. 5,304,602 disclosure in which wire is drawn through rollers, with the drawing tension contributing to breakage of HTSC wire and creation of the "sausage" problem. The HTSC wire made by that method has non-uniform cross sections at different spots.

It is further contemplated, according to this embodiment of the invention, that multiple, motorized rollers can be used, each in a series of which has decreasing diameter apertures between the rollers up to a critical density for the HTSC material. In this fashion, the HTSC wire dimensional reduction at any one stage is minimized and smoothly processed.

The driving roller dies disclosed here will solve the "sausage" and "crack" problem in HTSC wire and tape making processes and enhance $J_c$ of HTSC wire and tape. The same effect can be achieved by using one roller, and repeatedly passing the same tape through as the aperture is reduced.

Chemical Periodic Columnar Substitution Defects as Flux Pinning Centers. With respect to novel compositions and methods of enhancing $J_c$ by creating pinning centers in an HTSC to prevent creeping of magnetic flux, the following detailed description is provided.

The new HTSC materials of this invention provide for HTSC tape with substantially higher critical currents in the presence of magnetic fields at 77 K. Using the novel HTSC materials of this invention, HTSC tape can be made by electrophoretic method or other methods and is compatible with existing manufacturing processes such as the Powder in Tube method and above described methods. The particular innovative feature is a change in the crystal composition of BSCCO materials that greatly improves the "flux pinning" and thus allows them to carry much greater currents when wound in magnets or when operating in magnetic fields. It also reduces the AC loss characteristics of HTSC wire. The concept is economical and offers numerous features not obtainable with other, presently available HTSC wire.

Since their discovery in late 1986, high-temperature superconductors (HTSC) have received intense R&D attention in the hopes that the benefits of superconductivity would become available at easy-to-reach temperatures (e.g., 77 K) and thus make available a wide range of new applications. The state of the HTSC art is reviewed by Thomas P. Sheaker in "Introduction of high-temperature superconducting," Plenum Press, New York, herein incorporated by reference for this purpose. Although some $1.2 billion has been invested in this technology over the past eight years, it is significant that not a big commercial market has been developed for HTSC wires and coils yet (HTSC thin-films are finding some commercial applications in radar and communication systems, as well as in SQUID sensors). From many perspectives, the slow development of HTSC wires to overcome the cost and performance obstacles is disappointing, and presently published results suggest that improvements in current density and cost reductions have reached a plateau. Instead of orders of magnitude improvements, only 10–20% levels of improvement have been reported each of the last two years. Low-temperature superconductor wire can be operated with engineering current densities $J_e$ in excess of 100,000 amps/cm$^2$ in fields of 1–2 Tesla at temperatures in the 12–18 K range and cost about $30.00/kiloamp-meter. HTSC, by contrast, have $J_e$'s in the 5–10,000 amps/cm$^2$ range only in a low background fields (at 77 K) and cost more.

When an HTSC coil application must encounter modest magnetic fields, the current-carrying capacity drops still further, sometimes by a factor of 10 or more, depending on the temperature. This drop in $J_e$ further disadvantages HTSC wires. The sensitivity of $J_e$ to magnetic fields is reduced at lower temperatures, and for this reason, it has become recognized in recent years that temperatures in the 20–30 K range may be required for many applications, e.g., motors, generators, transformers, current limiters, MRI magnets, etc. Unfortunately, the benefits of HTSC at, say, 25 K, over LTS at 15 K has been far from compelling, especially when HTSCs cost more.

The genuine hopes for HTSC are to operate in significant commercial applications at 77 K, the temperature of liquid nitrogen. In order for this to become a reality, the current-carrying capacity at 77 K must be raised substantially. It is useful to distinguish three expressions for the current density of an HTSC wire: $J_c$ is the critical current in the HTSC filaments; $J_e$ is the "engineering" current density which takes account of the non-superconducting matrix material (usually silver); and $J_{\mathit{eff}}$ is the effective current density under given conditions of temperature and field. The critical current is that value above which the material becomes a normal, resistive conductor. All three quantities are functions of temperature and field.

$J_c(T,H)$ and $J_e(T,H)$ are frequently quoted at 77 K in "self-field," i.e., in the magnetic field produced by the current flowing. In many HTSC wires, the cross-sectional area of the HTSC filament is approximately 20–50% of the total cross-section. Thus $J_e$ is typically ⅕ to ½ the value of $J_c$, but it more accurately reflects the true overall current-carrying capacity of the wire when an HTSC wire is to be compared with a conventional copper wire.

The domain of superconductivity for all materials that display the property lies within a three-dimensional surface defined by the temperature, the current, and the magnetic field. When any of the three parameters exceeds its critical value, superconductivity ceases. In general, the critical current decreases as either the temperature or field strength is increased, and similarly in cyclic fashion for all the variables.

The particular problem with HTSC is that the critical current is especially sensitive to magnetic fields at 77 K, which is relatively close to the critical temperatures of HTSC materials, which lie, typically, in the 90–120 K range. This sensitivity is due to "flux creep," which arises when lines of magnetic flux move from site to site and do not remain in fixed locations in the material. Nearly all practical applications of HTSC wires require that the wire be exposed to modest or strong magnetic fields (1–3 Tesla), and when this happens, the nominal $J_e$ value plummets at 77 K.

The problem is easily illustrated in the case of large HTSC motors, above 2000 hp. Synchronous motors require DC magnetic poles on the rotor, and in conventional motors these are made by windings of copper wire around an iron "shoe." Since iron saturates at about 1.8 Tesla, obtaining higher fields is difficult, if not impossible. Larger currents generate larger $I^2R$ dissipation, requiring more cooling between the windings, which requires outer turns to be farther away, which, in turn, reduces their contribution to the field. The point of diminishing returns is quickly reached. HTSC coils, without an iron core, promise to enhance motor performance by permitting field strengths of 3–5 Tesla. However, HTSC cannot achieve such field strengths at 77 K because $J_e$ falls dramatically when the field strength exceeds even 0.1–0.2 Tesla. This situation forces the design of HTSC motors to much lower temperatures, generally about 20 K, and most experts believe that such temperatures, with their technical complexities and operating costs, make HTSC motors uneconomical, i e., the savings from increased efficiency are not great enough to offset the higher capital costs and life-cycle costs.

There are three possible strategies to deal with the decline in $J_{\mathit{eff}}$ at 77 K:

(1) If the critical temperature $T_c$ is raised, then 77 K as the operating temperature, $T_{op}$, becomes a smaller percentage of the critical value, allowing $J_{\mathit{eff}}$ to increase, ie., $J_{\mathit{eff}}$ is really a function of $T_{op}/T_c$.

(2) If $J_c$ is raised substantially, then a decline is more tolerable.

Both of these strategies present nearly insurmountable hurdles: raising $T_c$ requires finding new materials that become superconducting at much higher temperatures. Despite intense searches over the past years, no candidate materials are available. Similarly, raising $J_c$ significantly has not proved possible, despite serious efforts and significant dollar expenditures in improving the texturing and other processing parameters.

(3) The third route, described here, is to attack the flux creep problem. The reason that $J_{\mathit{eff}}$ falls precipitously with increasing field strength is that the lines of magnetic flux in a superconductor must be fixed, or pinned, in the material and not free to move from point to point. Although there are complex theoretical considerations, in somewhat simplified terms the magnetic field strength at any location within the material changes the energy of interaction of the electron-pairing that makes superconductivity possible. When flux lines are not pinned, the flux lines will start to move, thus diminishing superconductivity and reducing $J_e$. Moreover, energy is dissipated by flux creep, creating a de facto resistance, which negates what superconductors should do.

At higher temperatures, the lines of magnetic flux with thermal activation are allowed to move within HTSC materials, and this has numerous consequences. Flux line motion dissipates energy. When current flows, the flux line motion makes it necessary to supply a voltage to sustain that current, and hence the flux line motion acts as a de facto resistance, which defeats the idea of superconductivity. The flux lines are, of course, lines of magnetic field H; when a current flows the Lorentz force proportional to J×H is generated. The highly anisotropic nature of HTSC means that the dynamics of flux line motion is very different in the copper oxides than in LTSs.

A key point for the purposes of this disclosure is that stationary flux lines that do not move are not harmful to superconductivity. The consequences of an effective resistance arising from flux line motion are very great: Although BSCCO-2223 has an on-set $T_c \approx 110K$, in reality the resistance never reaches zero. In order to be useful and practical as a high temperature superconductor, the critical current density of a new high temperature superconductor in a magnetic field must be significantly improved.

Therefore, this disclosure teaches methods and compositions that enhance flux pinning. By increasing the number and quality of the flux pinning centers, superconductivity in the presence of a magnetic field is enhanced. Thus, with effective flux pinning, HTSC wires will take a giant step forward in meeting the needs for commercial products by increasing the current-carrying capacity of HTSC wires in practical coils at 77 K.

Among the numerous compositions that fall under the heading of HTSC materials, BSCCO-2223, nominally $(Bi_{1.8}Pb_{0.4})Sr_2Ca_2Cu_3O_{10}$, (Sato et al., 1991; Minot et al., 1994; Haldar et al., 1995) appears to have the most favorable properties for wire and coils. Like almost all HTSC compositions, BSCCO contains planes of copper and oxygen atoms joined by planes of other ions, and the Cu—O planes appear responsible for the superconductivity.

The problems of flux pinning have been discussed since the early days of HTSC and are also known from both theoretical and experimental work with LTS. In general, it is known that introducing defects in the crystal structure provide energy barriers that flux lines cannot easily cross, thus keeping the flux pinned. In LTS, such centers are introduced by increasing the number of lattice defects via impurities, dislocations from work hardening, etc. In HTSC, several approaches have been tried to enhance the pinning behavior, but most have shown relatively small effects. The most promising approach has been pioneered by Los Alamos National Laboratory and others (Maley et al., 1995; Thompson et al., 1994, Lephissa et al., 1993; Neumuller et al., to be published; Thompson et al., 1992) by subjecting the HTSC to radiation from high-energy proton or heavy-ion beams. By adjusting the energy of the incident beam, almost all the energy can be deposited at the depth of the filaments rather than dissipated in the sheath. Proton irradiation works by introducing a random distribution of lattice columnar defects that serve to trap lines of magnetic flux and keep them anchored.

The difficulty with proton irradiation is that it requires an expensive accelerator and the irradiation must be done in a vacuum, one centimeter at a time, which makes the process slow and expensive. Moreover, the long-term behavior of such lattice vacancies and displaced atoms is uncertain; since such defects are energetically unfavored, there is a possibility that over time, the defects will anneal out. In this case, $J_c$ will diminish with time. Such annealing, if it occurs, is accelerated by heat. If the coil undergoes a quench and causes the coil or parts of it to get hot, the critical pinning defects are destroyed. In addition, the random distribution of irradiation columnar defects is not very effective in comparison with the periodic distribution of chemical substitution pinning centers, introduced with a periodicity that is sufficient to pin low or high density of flux lines, as disclosed herein.

The potential market for HTSC-based products has been estimated at between $1 and $5 billion annually by year 2000, if, that is, the wire and coil performance can be brought to the level that it results in economic benefits. It is generally agreed within the industry and potential end-user communities that for economical viability the $J_e$ of HTSC wires must be increased approximately 10-fold, the cost must be similarly reduced, and, for AC applications, AC losses must be reduced.

This disclosure addresses the first need: increasing $J_e$, particularly at the economically desirable temperature of 77 K. This also has the effect of reducing costs. It also represents one step in reducing AC losses. Since each HTSC tape typically can carry a maximum current of 10–20 amps, in order to obtain high currents, multiple wires often must be wound in parallel; a coil for 100 amps, would require 5–10 such lengths of tape, which correspondingly increases the costs. When a coil is required to generate more than 1–2000 gauss (0.1–0.2 Tesla), the problems and costs are, of course, much worse, because flux creep reduces the critical current of each tape to only 2–5 amps, typically.

DC applications for HTSC wire and coils include motors, generators, MRI and magnetic separation magnets, accelerator magnets, and SMES. AC applications include transformers, some current limiters, underground transmission cables, inductive reactors for power systems, and others. Of these, only cables operating at 77 K under commercial conditions can compete with presently available wire. All the other applications are impractical and uneconomical or impossible at 77 K owing, in significant part, to flux creep. Thus, the flux pinning disclosed herein plays a crucial role in overcoming present hurdles to commercialization and is especially timely.

In addition to industrial applications, a number of military applications for HTSC coils have been identified. These include homopolar motors for ship propulsion, SMES for burst power applications, magnets for minesweeping operations, and light-weight generators for airborne applications. This disclosure will serve to enable these applications as well.

According to this aspect of the invention, pinning centers are created by adding carefully chosen and controlled "impurities" to create periodic lattice distortions that act as pinning centers. The benefit of modifying the chemical composition is that the lattice distortions will not anneal out, and they permanently modify the HTSC within the wire prior to winding a coil.

It is recognized that changing the chemical composition may reduce $T_c$ a certain amount. This, however, is a price that represents a good trade-off. That is, as long as $T_c$ remains well above 77 K, the benefits of increasing $J_e$ to usable values far outweigh this penalty.

It is important to note that this method is expected to have wide applicability and thus benefit the entire HTSC industry. The copper-oxide class of HTSC materials have quite similar structures involving one to three planes of $CuO_2$ networks separated by calcium layers (or YTTRIUM layers in YBCO) and other layers. Therefore, the controlled introduction of chemically-induced pinning centers can be applied equally to BSCCO-2223, BSCCO-2212, YBCO, and thallium-1212 compositions. The method is also applicable to various manufacturing processes, including react-and-wind powder-in-tube (PIT) methods, metallic precursor (MP) methods, wind-and-react methods, and electrophoretic deposition methods.

Pinning centers are induced in BSCCO by adding controlled concentrations of yttrium to substitute for calcium in the HTSC lattice. Pinning centers effectively reduce flux creep and raise $J_e$ at 77 K in fields of 1 Tesla and higher. These centers may be introduced into long-length HTSC wires.

The results of the flux pinning, in combination with superconducting HTSC joints, reducing the amount of or eliminating the silver sheathing of HTSC wires, and novel procedures for obtaining texturing and reducing the cost of manufacturing processes for HTSC wires all combine to make the instant disclosure a unified and significant advance in the field of HTSC technology.

Controlled yttrium substitution for calcium in bismuth- and thallium-based copper oxide superconductors results in significantly enhanced flux pinning. The concept works with a variety of different processing methodologies. The benefits of enhanced flux pinning are obtained without causing unacceptable deterioration in other important parameters, such as overall values of $J_e$, processing complexities, wire flexibility and integrity, etc.

Given the disclosure herein, one skilled in the art is enable, without undue experimentation, to optimize a host of parameters-composition, heat treatment temperatures and rates of change, deformation, oxygen stoichiometry, and texturing:

It has been demonstrated that chemical detects, such as second enhance pinning effects (Babic et al., 1994; Dou et al., 1992; Liu et al., 1991; Sengupta et al., 1993) and that yttrium (Y) in large amounts (10–50%) substitutes for calcium (Ca) in the in lead cuprates and Tl—V—Sr—Ca—Cu—O systems(Liu et al., 1990) and Bi-2212 (Calestani et al., 1993; Calestani et al., 1993) and does not affect Tc (superconducting transition temperature). For type II superconductors, the interface between normal core and superconducting phase has a negative surface energy, creating pinning effects (Rose-Innes et al., 1978; Tilley eta., 1990; Sheaker, 1994). This disclosure teaches that low concentration chemical substitution creates substantial pinning effects and minimal distortion to the superconducting structure. Substituting about 2 atomic percent Y for Ca produces a uniform distribution of microscopic columnar defects. $Y^{3+}$ has an ionic radius of 1.62 Å, which is 7% smaller than that of $Ca^{2+}$ at 1.74 Å. This is close enough not to significantly affect the crystal structure that is responsible for superconductivity, while at the same time introducing numerous local distortions of the crystal field to serve as pinning centers.

Previous work has shown that Y substitutes for the Ca sites, but not for the Sr and Bi sites. However, the goal of previous work was to raise $T_c$, and hence rather large Y/Ca ratios were explored. Under these conditions, with too much yttrium, mixed phases result, and a uniform, homogeneous HTSC material is not obtained. However, with the low concentrations disclosed herein, there is no effect on the stoichiometry and no mixed-phase formation, which will create substantial pinning effects with minimum distortion of the HTSC lattice structure.

It is known (Zhou et al., 1989) that mixed valence states, i.e., non-integral valence numbers, promote superconductivity. The admixture of $Y^{3+}$ into the $Ca^{2+}$ sites enhances mixed valency and creates a different charge distribution that contributes both to superconductivity and to pinning the flux lines. This view is supported by the known properties of $YBa_2Cu_3O_7$ which is generally regarded as having the best flux-pinning properties.

A ratio of Y/Ca≈2/100 introduces lattice distortions with an average periodicity of 2x, where x is the coherence length in the O—Cu—O planes, which is on the order of 20 Å. This fosters flux pinning without significantly reducing $T_c$. Pinning effect and critical current density improve by factors of 5- to 10-fold.

Rare earth atoms have been shown (Xue et al., 1991; Ren et al., 1993; Chen et al., 1991) to increase the required biaxial alignment in Bi and Tl compounds and increase pinning effects. A high degree of coplanar, "textured" alignment is essential for achieving high values of $J_c$. The advantage of low concentration chemical substitution disclosed here is that pinning effects are created with minimal distortion to the superconducting lattice.

The introduction of controlled lattice distortions via Y-substitution provides periodic columnar flux pinning. This periodic pinning center array is very effective for flux pinning.

The energy barriers introduced by the lattice distortions increase the creep temperature, i.e., when higher energy barriers to flux movement exist, the "flux melting" temperature is increased. This is exactly the result desired, because higher flux melting temperature means that at 77 K the creep is reduced.

Flux creep in BSCCO is generally recognized to be due to weak pinning at the Ca sites and thick insulation layers in the structure. By substituting Pb for Bi and Y for Ca the pinning effect is enhanced. By substituting Pb and V for Bi and Y for Ca the pinning effect is enhanced.

Chemically substituted pinning centers are stable. In contrast to radiation-induced defects, there is little danger that the centers will anneal out and decay with time or temperature.

The proposed advance in enhanced $J_c$ via Y-induced pinning centers has low cost and is easy to implement.

The key element in the proposed effort is a coherent program to consolidate the incomplete results of various research results to produce HTSC wire with enhanced flux pinning and greatly improved performance in real-world environments. Y can substitute easily for Ca in all important HTSC compositions (Xue et al., 1991; Ren et al., 1993; Chen et al., 1991), and $T_c$ and is affected little or not at all. While previous work has provided evidence that Y can replace Ca, only a few high-concentration substitution systems were investigated with only a narrow range of parameters and with different objectives. Previous work is concentrated to Tl systems, lead cuprate systems and Bi-2212 systems, and while no one has studied this substitution in Bi-2223 systems. Also previous work was concentrated to $T_c$ studies, the serious $J_c$ study was ignored.

In addition to yttrium, it is anticipated that other rare earth ions and other chemical element substitution pinning centers will yield similar advantages. In addition, a combination of flux pinning techniques is better than any single method alone.

In one embodiment of this aspect of the invention, BPSCYCO-2223 ($Bi_{1.8}Pb_{0.4}Si_2Ca_2Y_{2-y}Cu_3O_{10+y}$) is used because BPSCCO-2223 is the most popular candidate for HTSC applications at present.

Accordingly, BPSCYCO-2223 powders are prepared with various Y/Ca ratios ranging from 0.01 weight percent to 10 weigh percent. $Y_2O_3$ powder is used in place of CaO. The powder is mixed in a ball mill or by other known mixing technology, such as nitrate spray technology and the melting mixing method that is described in this disclosure and subjected to repeated heat treatments and regrinding in accord with present practices to achieve intimate mixing. Particle sizes are kept less than 5 microns.

Pellets of the powder are formed by pressing to achieve high densification, generally >80% of theoretical.

Alternatively, HTSC powder is electrophoretically deposited to Ag tape to achieve good alignment and high density.

The pellets are packed in a silver tube, pressed again to high density, and the tube is sealed.

Alternatively, two deposited HTSC tapes on Ag tapes are pressed to a closed HTSC tape, with HTSC materials inside and Ag tapes outside.

The tube is deformed by swaging, or drawing and rolling to its final dimensions, thus forming a tape containing a monofilament of HTSC material surrounded by a silver sheath.

Alternatively, the HTSC tape is deformed by rolling to its final dimensions.

The tape is given a final heat treatment in the range 830–840° C. for periods of 60–180 hours.

Another specific embodiment of the subject invention pertains to a method for making high temperature superconductor tapes, or high temperature superconductor wires, which is called the coated textured tapes in tube (CTTIT) method. These coated textured tapes can be made by any coating method such as an electrophoretic coating method, electrodeposition method, MOCVD, CVD, laser deposition, electron beam deposition, sputtering, dip coating, doctor blade method, or any other suitable coating method.

Coated tapes can have thin film or thick film coatings.

These coated tapes can be used to make a superconducting wire or tape by, for example, packing the highly textured tapes in a sealed or unsealed tube, or by packing the highly textured tapes in a foil which can be folded into a tube which surrounds the textured tapes. It is preferred to maintain the textured tapes parallel to each other during the manufacturing process. After the coated textured tape is loaded in the tube, the drawing, rolling, and heat treatment processes can be repeated. This method can be applied to any high temperature superconducting material, for example, BPSCCO-2223 materials. Advantageously, this method utilizes highly textured tapes as the starting material, resulting in a final product with good texture and high critical current.

Each tape is characterized at 77 K for $J_c$ as a function of magnetic field. The 1 $\mu$V/cm criterion is used to determine the critical current in background fields ranging from 0 to 2 Tesla.

Each of the above is repeated for different concentrations, different heat treatments, and, if warranted, with different rare earth elements. Thallium-1212, BSCCO-2212, BSCCO-2223, and other HTSC formulations, may likewise be used as described above.

According to the instant disclosure, there are three classes of HTSC compounds which are novel and preferred:

1. $Bi_{(2-X-Y)\pm\alpha}Pb_X V_Y Sr_2 Ca_{2-Z} Y_Z Cu_3 O_{10\pm\delta}$
    wherein:
    X is from about 0 to 1;
    Y is from about 0. to 1;
    $\alpha$ is from about 0.01 to 0.5;
    Z is from about 0.001 to 0.5; and
    $\delta$ is from about 0.01 to about 0.3.
2. $Bi_{(2-X-Y)\pm\alpha}Pb_X Sr_2 Ca_{2-Z} Y_Z Cu_3 O_{10\pm\delta}$, wherein all variables are as defined as above.
3. $Bi_{2\pm\alpha} Sr_2 Ca_{2-Z} Y_Z Cu_3 O_{10\pm\delta}$, wherein all variables are as defined as above.

Thus, these HTSC ceramics may be generally defined by the formula:

$$Bi_{(2-X-Y)\pm\alpha}Pb_X V_Y Sr_2 Ca_{2-Z} Y_Z Cu_3 O_{10\pm\delta}$$

wherein:
X is from about 0 to 1;
Y is from about 0 to 1;
$\alpha$ is from about 0.01 to 0.5;
Z is from about 0.001 to 0.5; and
$\delta$ is from about 0.01 to about 0.3.

These compositions are HTSC materials at 77K which exhibit improved $J_c$ through provision of chemical periodic substitution defects (i.e. pinning centers) which reduce flux creep and thereby resistivity. Within the crystal structure of these compounds, Ytrium substitution for some of the calcium stoms introduces chemical "defects" i.e. distortions, at controllable periodicity within the HTSC.

In $(BiPb)_2 Sr_2 (CaY)_2 Cu_3 O_{10}$, for example, a tetragonal structure is produced wherein:
a≈3.85 Å
b≈20 Å on the $CuO_2$ plane, and
c≈35.6 Å

Therefore, introduction of pinning centers at a ratio of Y:Ca of about 2/100, a periodicity of Y substitution at about 40 Å intervals introduced. Thus, the uniform distribution of Y (or similar element such as Sm, Ctd, Sy, Er, Tm, Yb, Lu etc.) at very low concentrations creates ideal pinning centers. The additional substitutions of lead and vanadium for Bi enhance the pinning effects induced by the Y substitution for Ca, by creating periodic columnar chemical pinning centers.

The description of the preferred embodiments contained herein is intended in no way to limit the scope of the invention. As will be apparent to a person skilled in the art, modifications and adaptions of the structure and method of the above-described invention will become readily apparent without departure from the spirit and scope of the invention, the scope of which is described in the appended claims.

REFERENCES

Castelani, et al., (1993) "Effects of Simultaneous Pb/Bi and Y/Ca Substitution on Structural and Superconducting Properties of the 2212 BSCCO Phase," J. Alloys and Compounds 195:315–322.

Castelani et al., (1993) "Effects of the Annealing Conditions on the Structural and Superconducting Properties of $Bi_{2-x}Pb_xSr_2Y_{0.2}Ca_{0.8}Cu_2O_z$," Physica 206:33–42.

Chanda, B and Dey, T. K. (1993) "Heat Conduction in Vanadium Substituted $(Bi_{0.8} Pb_{0.2-y}V_y)_2 Sr_2 Ca_2 Cu_3 O_x$ Sintered Pellets Between 10 and 150K," 33:980–985.

Che, et al., (1989) "Composition and Superconductivity in Bi—Sr—Ca—Cu—O and Substituted Systems," J. Mater. Sc. 24:1725–1728.

Chu, C. T. and Dunn, B., (1989) "Fabrication of $YBa_2Cu_3O_{7-y}$ Superconducting Coatings by Electrophoretic Deposition," Appl. Phys. Lett 55:492–494.

Ehmann, et al., (1993) "Bi Cuprates of Type 1212—a new Family of Superconductors in the Bi Series," Journal of Alloys and Compounds 195:57–60.

Fung, et al., (1990) "Vanadium Substituted 2212 and 2223 Superconducting Ceramics," Solid State Communications 75:211–216.

Kao, et al., (1994) "A Study of Bi—Pb—Sr—Ca—Cu—O/Ag Tape Prepared by the Jelly-Roll Process," Supercond. Sci. Technol. 7:470–472.

Kao, et al., (1993) "Fabrication of $Bi_{1.7}Pb_{0.4}Sr_{1.6}Ca_{2.4}Cu_{3.6}O_y$ Superconducting Films on Silver Substrates by the Electrophoretic Deposition Technique," J. Mater. Sci. 12:1793–1794.

Hein et al., (1989) "Electrophoretic Deposition of Textured $YBa_2Cu_3O_{7-x}$ Films on Silver Substrates," J. Appl. Phys. 66:5940–5943.

Ho, et al., (1991) "Melt-Textured Thick Films of $Bi_{1.7}Pb_{0.3}Sr_2CaCu_2O_y$ Prepared by Electrophoretic Deposition,"

Liu et al., (1990) "Superconductivity up to 105K in the New High-$T_c$ Tl—V—Sr—Ca—Cu—O and Tl—V—Sr—Ca—Y—Cu—O Systems," Solid State Communications 76:1261–1265.

Murayama, et al., (1990) "Hot-Pressing of Bi—Pb—Sr—Ca—Cu—O Superconducting Thick Film," Jap. J. appl. Phys. 29:875–877.

Mutoh, et al., (1990) "Diffusion Bonding of Bi—Pb—Sr—Ca—Cu—O High-Tc Superconductors," Jap. J. Appl. Phys. 29:1432–1434.

Nojima, et al., (1990) "Fabrication of Y—Ba—Cu—O Superconducting Films on Cu Substrates by an Electrophoretic Deposition Technique," Jap. J. Appl. Phys. 29:1655–1658.

Pont et al., (1993) "Effect of Cr and V Substitution on the Properties of Bulk Tl-Based Superconductors," Cryogenics 33:91–96.

Sarkar, et al., (1991) "Fabrication of Textural Bi—Sr—Ca—Cu—O Thick Film by Electrophoretic Deposition," J. Appl. Phys. 69:1775–1777.

Sato, et al., U.S. Pat. No. 5,051,397, issued Sep. 24, 1991.

Tallman, Richard, U.S. Pat. No. 5,004,722, issued Apr. 2, 1991.

Tkaczyk et al., (1993) "Superconducting Joints Formed Between Powder-In-Tube $Bi_2Sr_2Ca_2Cu_3O_z$/Ag Tapes," IEEE Trans. Mag 3:946–948.

Woolf, et al., (1991) "Fabrication of Long Length Bi-2223 Superconductor Tape Using a Continuous Electrophoretic Coating Process," Appl. Phys. Letter 58:534

Wong, et al., U.S. Pat. No. 5,098,868, issued Mar. 24, 1992.

Xin et al., (1990) "Optimum Fabrication Process and Some Relevant Analysis for the Vanadium-Lead Doubly Substituted 2223 Superconducting Ceramics," *Solid State Communications* 76:1347–1350.

Xin et al, (1990) "Vanadium-Lead Substituted 2223 Bi—Sr—Ca—Cu—O Superconductors," *Solid State Communications* 76:1351–1356.

Xue, et al. (1991) "Crystal Growth and Characterization of Superconducting Lead Cuprates," *J. Crystal Growth* 113:371–378.

Yamamoto, et al., U.S. Pat. No. 5,304,602, issued Apr. 19, 1994.

Zhou, Dawei, U.S. Pat. No. 5,219,832, issued Jun. 15, 1993.

What is claimed is:

1. A method for making a high temperature superconductor coated textured tape in a tube (CTTIT), comprising the steps of:
   a) making a high temperature superconducting textured tape by coating a high temperature superconductor material onto at least one substrate material;
   b) repeating steps a) to form a plurality of said textured tapes;
   c) packing said plurality of textured tapes into a hollow body, wherein said coated surfaces of said plurality of textured tapes are positioned parallel to one another through a length of said hollow body;
   d) rolling said packed hollow body;
   e) heating said rolled packed hollow body; and
   f) repeating steps d) and e) as required to achieve a specified dimension.

2. The method for making a CTTIT according to claim 1, wherein said substrate material is inert to oxygen and inert to said HTSC material.

3. The method for making a CTTIT according to claim 1, wherein said high temperature superconducting material comprises;

$$Bi_{(2-x\pm)}Pb_xSr_2Ca_2Cu_3O_{10\pm\delta}$$

wherein
x is from 0 to 1
is from 0.01 to 0.5
δ is from 0 to 1.

4. The method for making a CTTIT according to claim 3, wherein said coated substrate material is heated to about 830° C.<T<840° C. for 60 to 180 hours.

5. The method for making a CTTIT according to claim 1, wherein said high temperature superconducting material comprises;

$$Bi_{(2-x-y)\pm}Pb_xV_ySr_2Ca_{2-z}Y_zCu_3O_{10\pm\delta}$$

wherein
x is from 0 to 1
y is from 0 to 1
is from 0.01 to 0.5
z is from 0 to 0.5
δ is from 0 to 1.

6. The method for making a CTTIT according to claim 1, wherein said high temperature superconducting material is selected from the group consisting of BiSrCaCuO-2212-system high temperature superconductors, TlSrCaCuO-system high temperature superconductors, YBCO-system high temperature superconductors, and HgBaCaCuO-system high temperature superconductors.

7. The method for making a CTTIT according to claim 1, wherein said hollow body is sealed.

8. The method for making a CTTIT according to claim 1, wherein said hollow body is unsealed.

9. The method for making a CTTIT according to claim 1, wherein said hollow body is made from a material selected from the group consisting of Ag-metal, Ag-alloy, stainless steal, copper-nickel alloy, Ag-coated stainless steal, Ag-coated copper-nickel alloy, copper, copper alloy, Ag-coated copper, Ag-coated copper alloy, Ag-coated metal, and Ag-coated alloy.

10. The method for making a CTTIT tape according to claim 8, wherein said coating method is selected from the group consisting of, electrophoretic coating, electro deposition, MOCVD, CVD, laser deposition, electron beam deposition, sputtering, dip coating, doctor blade coating, spraying, and immersion.

11. A method for making a continuous high temperature superconductor coated textured tape in a tube (CTTIT), comprising the steps of:
   a) making a high temperature superconducting textured tape by coating a high temperature superconductor material onto at least one substrate material;
   b) repeating steps a) to form a plurality of said textured tapes;
   c) placing said plurality of textured tapes onto a continuous sheet of foil, wherein said coated surfaces of said plurality of textured tapes are positioned parallel to one another through a length of said sheet of foil;
   d) folding said sheet of foil about said plurality of textured tapes, such that said foil forms a tube about said textured tapes;
   e) rolling said foiled textured tapes;
   f) heating said foiled textured tapes; and
   g) repeating steps d) and e) as required to achieve a specified dimension.

12. The method for making a continuous CTTIT according to claim 11, further comprising after step a) the intervening step rolling said textured tape.

13. The method for making a continuous CTTIT according to claim 11, further comprising after step d) the intervening step of drawing said folded textured tapes.

14. The method for making a continuous CTTIT according to claim 11, wherein said substrate material is selected from the group consisting of Ag-metal, Ag-alloy, stainless steal, copper-nickel alloy, Ag-coated stainless steal, Ag-coated copper-nickel alloy, copper, copper alloy, Ag-coated copper, Ag-coated copper alloy, Ag-coated metal, and Ag-coated alloy.

15. The method for making a continuous CTTIT according to claim 11, wherein said substrate material is inert to oxygen and inert to said HTSC material.

16. The method for making a continuous CTTIT according to claim 11, wherein said high temperature superconducting material comprises;

$$Bi_{(2-x\pm)}Pb_xSr_2Ca_2Cu_3O_{10\pm\delta}$$

wherein
x is from 0 to 1
is from 0.01 to 0.5
δ is from 0 to 1.

17. The method for making a CTTIT according to claim 16, further comprising after step a) the intervening step rolling said textured tape.

18. The method for making a CTTIT according to claim 16, further comprising after step d) the intervening step of drawing said packed hollow body.

19. The method for making a CTTIT according to claim 16, wherein said substrate material is selected from the group consisting of Ag-metal, Ag-alloy, stainless steal, copper-nickel alloy, Ag-coated stainless steal, Ag-coated copper-nickel alloy, copper, copper alloy, Ag-coated copper, Ag-coated copper alloy, Ag-coated metal, and Ag-coated alloy.

20. The method for making a continuous CTTIT according to claim 16, wherein said coated substrate material is heated to about 830° C.<T<840° C. for about 60 to 180 hours.

21. The method for making a continuous CTTIT according to claim 11, wherein said high temperature superconducting material comprises;

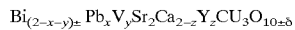

$$Bi_{(2-x-y)\pm}Pb_xV_ySr_2Ca_{2-z}Y_zCU_3O_{10\pm\delta}$$

wherein x is from 0 to 1 y is from 0 to 1 is from 0.01 to 0.5 z is from 0 to 0.5

δ is from 0 to 1.

22. The method for making a continuous CTTIT according to claim 11, wherein said high temperature superconducting material is selected from the group consisting of BiSrCaCuO-2212-system high temperature superconductors, TlSrCaCuO-system high temperature superconductors, YBCO-system high temperature superconductors, and HgBaCaCuO-system high temperature superconductors.

23. The method for making a continuous CTTIT according to claim 11, wherein said foil is made from a material selected from the group consisting of Ag-metal, Ag-alloy, stainless steal, copper-nickel alloy, Ag-coated stainless steal, Ag-coated copper-nickel alloy, copper, copper alloy, Ag-coated copper, Ag-coated copper alloy, Ag-coated metal, and Ag-coated alloy.

24. The method for making a continuous CTTIT tape according to claim 11, wherein said coating method is selected from the group consisting of, electrophoretic coating, electro deposition, MOCVD, CVD, laser deposition, electron beam deposition, sputtering, dip coating, doctor blade coating, spraying, and immersion.

* * * * *